United States Patent
Uetani et al.

(10) Patent No.: US 9,505,201 B2
(45) Date of Patent: Nov. 29, 2016

(54) METHOD FOR MANUFACTURING CERAMIC DEVICE

(71) Applicant: NGK INSULATORS, LTD., Nagoya (JP)

(72) Inventors: Masayuki Uetani, Kasugai (JP); Takao Ohnishi, Fuso-Cho (JP); Takeshi Kaku, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 250 days.

(21) Appl. No.: 14/039,561

(22) Filed: Sep. 27, 2013

(65) Prior Publication Data

US 2014/0027053 A1    Jan. 30, 2014

Related U.S. Application Data

(63) Continuation of application No. PCT/JP2012/058131, filed on Mar. 28, 2012.

(30) Foreign Application Priority Data

Mar. 31, 2011 (JP) ................. 2011-080887

(51) Int. Cl.
| | |
|---|---|
| *B32B 38/10* | (2006.01) |
| *B28D 5/00* | (2006.01) |
| *H01L 41/337* | (2013.01) |
| *B32B 38/00* | (2006.01) |
| *B32B 38/08* | (2006.01) |
| *H01L 41/338* | (2013.01) |

(52) U.S. Cl.
CPC ......... *B32B 38/0004* (2013.01); *B28D 5/0011* (2013.01); *B32B 38/08* (2013.01); *H01L 41/338* (2013.01); *Y10T 156/1082* (2015.01)

(58) Field of Classification Search
CPC ..... B28D 5/022; B28D 5/0011; B32B 27/16; B32B 43/003; B32B 37/02; B32B 38/0004; B32B 38/06; B32B 38/10; B29C 2793/00; B29C 2791/001; H01L 41/332; H01L 41/338; Y10T 156/1026; Y10T 156/1064; Y10T 156/1082

See application file for complete search history.

(56) References Cited

U.S. PATENT DOCUMENTS

| | | |
|---|---|---|
| 2004/0109629 A1 | 6/2004 | Kondo |
| 2004/0110395 A1 | 6/2004 | Ueda et al. |

(Continued)

FOREIGN PATENT DOCUMENTS

| | | |
|---|---|---|
| JP | 63-033840 A1 | 2/1988 |
| JP | 06-091057 B2 | 11/1994 |
| JP | 2004-126152 A1 | 4/2004 |

(Continued)

OTHER PUBLICATIONS

Machine translation of patent JP 2004-126152 to Takayui titled "Optical Interconnection Circuit, Method for Manufacturing Optical Interconnection Circuit, Electrooptical Apparatus, and Electronic Equipment", published Apr. 22, 2004, 24 pages.*
International Search Report and Written Opinion dated Jun. 19, 2012.

*Primary Examiner* — Linda L Gray
(74) *Attorney, Agent, or Firm* — Burr & Brown, PLLC

(57) ABSTRACT

A method for manufacturing a ceramic device is provided including fixing a ceramic substrate to a reinforcing plate via a sacrifice layer, forming a groove, which penetrates the ceramic substrate and the sacrifice layer and reaches the reinforcing plate, on an upper surface of the ceramic substrate to divide the ceramic substrate into plural ceramic substrates, and removing the sacrifice layer.

18 Claims, 16 Drawing Sheets

(56) References Cited

U.S. PATENT DOCUMENTS

| | | |
|---|---|---|
| 2008/0050858 A1 | 2/2008 | Ono et al. |
| 2010/0314043 A1 | 12/2010 | Imai et al. |
| 2013/0009520 A1* | 1/2013 | Kobayashi ........... G11B 5/4873 310/365 |

FOREIGN PATENT DOCUMENTS

| | | |
|---|---|---|
| JP | 3962282 B2 | 8/2007 |
| JP | 2008-053250 A1 | 3/2008 |
| JP | 2009-133924 A1 | 6/2009 |
| JP | 2010-287723 A1 | 12/2010 |

* cited by examiner

METHOD FOR MANUFACTURING CERAMIC DEVICE

CROSS-REFERENCE TO RELATED APPLICATION

This is a Continuation of International Application No. PCT/JP2012/058131 filed on Mar. 28, 2012, which claims priority to Japanese Patent Application No. 2011-080887 filed on Mar. 31, 2011, the disclosure of which is hereby incorporated by reference herein in its entirety.

BACKGROUND OF THE INVENTION

Field of the Invention

A technique disclosed in this specification relates to a method for dividing a ceramic substrate into plural ceramic substrates to manufacture a ceramic device.

Description of Related Art

As a method for dividing a ceramic substrate into plural ceramic substrates to manufacture a ceramic device, there is known a technique for adhering and fixing the ceramic substrate on a film and dicing the fixed ceramic substrate.

Japanese Patent Application Publication No. 2010-287723 discloses a method for sticking a substrate to a supporting plate using an adhesive.

SUMMARY OF THE INVENTION

When a groove is formed by a dicing blade, a bottom surface of the groove tends to be roughened. In the above-mentioned technique for dicing the ceramic substrate adhered on the film, a dicing saw shaves a part of an adhesive layer to cut the ceramic substrate. That is, the groove is formed at a depth that penetrates the ceramic substrate and reaches the adhesive layer. Therefore, the bottom surface of the groove is configured by the adhesive layer. When the bottom surface of the groove is configured by the soft adhesive layer in this way, the bottom surface of the groove (i.e., a cut surface of the adhesive layer) is in an extremely roughened state. For example, narrow chips sometimes remain on the cut surface while being connected to the adhesive layer. When the cut surface of the adhesive layer is roughened in this way, a failure could occur in a later process. For example, in some case, the chips connected to the adhesive layer adhere to a ceramic device and the adhered chips may cause a failure in the later process.

There is also a technique for cutting the ceramic substrate through blasting. When the groove penetrating the ceramic substrate and reaching the adhesive layer (i.e., the groove having the bottom surface configured by the adhesive layer) is formed by the blasting, a large amount of media (abrasive grains) for the blasting is caught in the adhesive layer configuring the bottom surface of the groove. In the later process, the media caught in the adhesive layer sometimes falls off therefrom and cause a failure.

Therefore, in this specification, there is provided a method for manufacturing a ceramic device with which a ceramic substrate can be suitably cut and a failure is not caused in a later process.

A method for manufacturing a ceramic device disclosed by this specification includes fixture of a ceramic substrate, formation of a groove, and removal of a sacrifice layer. In the fixture of the ceramic substrate, the ceramic substrate is fixed to a reinforcing plate via the sacrifice layer. In the formation of the groove, the groove is formed on an upper surface of the ceramic substrate to divide the ceramic substrate into plural ceramic substrates. The groove penetrates the ceramic substrate and the sacrifice layer and reaches the reinforcing plate. Then the sacrifice layer is removed. The ceramic substrate referred to herein is a concept including all of a dielectric ceramic substrate, a piezoelectric ceramic substrate, an electrostrictive ceramic substrate, a pyroelectric ceramic substrate, a ferroelectric ceramic substrate, an inorganic compound substrate, a metal oxide substrate, and the like and includes a substrate having an electrode on an upper surface or an inside thereof. That is, in this application, the ceramic substrate refers to an elemental ceramic substrate or a ceramic substrate in which an electrode is formed.

In this manufacturing method, the groove penetrating the ceramic substrate and the sacrifice layer and reaching the reinforcing plate is formed. When the groove is formed to penetrate the sacrifice layer by the dicing, a cut surface of the sacrifice layer is suppressed from being roughened. When the groove is formed in this way, a bottom surface of the groove is configured by the reinforcing plate. A material that is hard and has high machinability can be adopted as the reinforcing plate. Therefore, a cut surface of the reinforcing plate is also suppressed from being roughened. Therefore, in this manufacturing method, a surface of the groove is smoother than a surface of a conventional groove. Since narrow chips do not remain while being connected to the cut surface, a failure is suppressed from occurring in a later process. Also, when the groove is formed to penetrate the sacrifice layer by the blasting, media are less easily caught in the sacrifice layer. When the groove is formed in this way, the bottom surface of the groove is configured by the reinforcing plate. Since the material that is hard and has high machinability can be adopted as the reinforcing plate, the media are hardly caught in the reinforcing plate. Therefore, the failure is suppressed from being caused by the media falling off of an inner surface of the groove in the later process. As discussed above, even when either one of the machining methods is used when forming the groove, according to this manufacturing method, it is possible to suitably form the groove and suppress the occurrence of the failure in the later process.

Another manufacturing method for a ceramic device disclosed by this specification includes fixture of a ceramic substrate, formation of a groove, and removal of a sacrifice layer. In the fixture of the ceramic substrate, the ceramic substrate is fixed to a reinforcing plate via the sacrifice layer. In the formation of the groove, the groove is formed on an upper surface of the ceramic substrate to divide the ceramic substrate into plural ceramic substrates. The groove penetrates the ceramic substrate and reaches the sacrifice layer. Then the sacrifice layer is removed. The sacrifice layer includes a resin portion and particles dispersed in the resin portion, the particles are harder than the resin portion, a glass transition temperature of the sacrifice layer is 80 degrees Celsius or more, and a Young's modulus of the sacrifice layer is 6 GPa or more.

With such a configuration, a bottom surface of the groove is configured by the sacrifice layer. However, in this manufacturing method, the glass transition temperature of the sacrifice layer is 80 degrees Celsius or more and the Young's modulus of the sacrifice layer is 6 GPa or more. When the bottom surface of the groove is configured by such a sacrifice layer, the bottom surface of the groove is hardly roughened when the groove is formed. Further, the hard particles are dispersed in the sacrifice layer. When the groove is formed by a dicing blade, the dicing blade is dressed by the particles. Therefore, the bottom surface of the groove is further suppressed from being roughened.

Still another manufacturing method for a ceramic device disclosed by this specification includes formation of a sacrifice layer, fixture of a ceramic substrate, formation of a groove, and removal of the sacrifice layer. In the formation of the sacrifice layer, the sacrifice layer is formed on a lower surface of the ceramic substrate. In the fixture of the ceramic substrate, the ceramic substrate is fixed to a reinforcing plate via a thermosetting sheet so that the thermosetting sheet is in contact with the sacrifice layer. In the formation of the groove, the groove is formed on an upper surface of the ceramic substrate to divide the ceramic substrate into plural ceramic substrates. The groove penetrates the ceramic substrate and the sacrifice layer and reaches the reinforcing plate. Then the sacrifice layer is removed. The thermosetting sheet includes a resin portion and particles dispersed in the resin portion. The particles are harder than the resin portion. A glass transition temperature of the thermosetting sheet is 80 degrees Celsius or more. A Young's modulus of the thermosetting sheet is 6 GPa or more.

When the groove is formed to reach the sheet (i.e., a bottom surface of the groove is configured by the sheet) in this way, by configuring the sheet as explained above, it is possible to suppress the bottom surface of the groove from being roughened.

BRIEF DESCRIPTION OF DRAWINGS

FIG. 18 is a longitudinal sectional view of the ceramic substrate 10 after implementation of step S2a.

FIG. 19 is a longitudinal sectional view of the reinforcing plate 20 after implementation of step S4a.

FIG. 20 is a longitudinal sectional view of the laminated body 60 after implementation of step S6a.

DETAILED DESCRIPTION OF THE INVENTION

In manufacturing methods according to embodiments explained below, a ceramic substrate formed into a thin sheet shape is finely cut and at least a cut surface is covered with resin to manufacture a ceramic device used as a piezoelectric device or the like. The manufacturing methods according to the embodiments are suitable for manufacturing a small (e.g., rectangular with a size of 0.2 mm×0.8 mm) ceramic device by cutting a thin ceramic substrate having thickness of 5 to 150 μm.

First Embodiment

Figure 1:
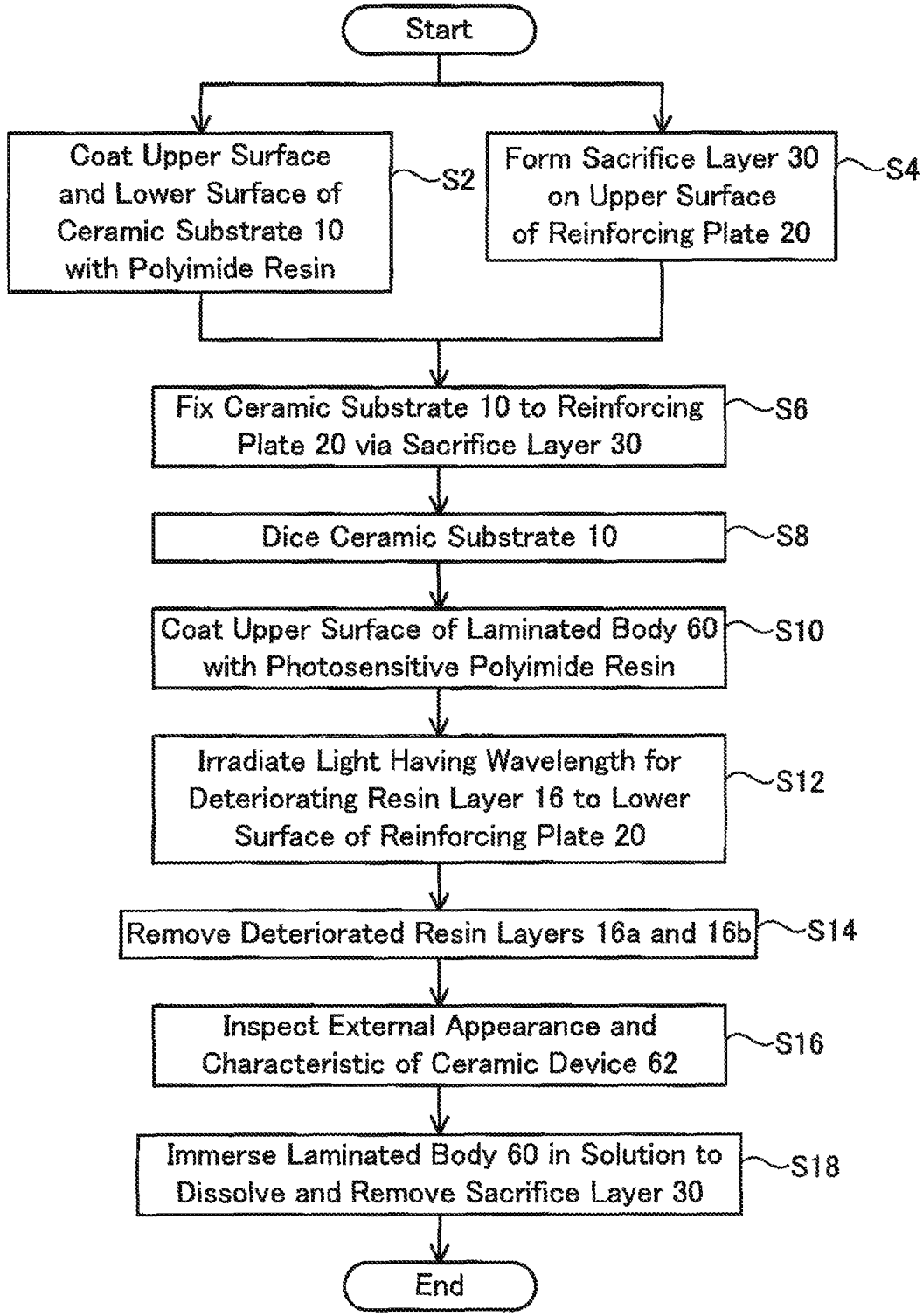
FIG. 1 is a flowchart for explaining a manufacturing method according to a first embodiment.
Figure 2:
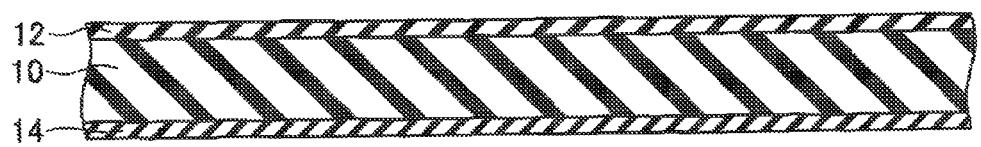
FIG. 2 is a longitudinal sectional view of a ceramic substrate 10 after implementation of step S2.

FIG. 1 is a flowchart for explaining a manufacturing method according to a first embodiment. In step S2, polyimide resin is applied to an upper surface and a lower surface of a ceramic substrate 10. The ceramic substrate 10 is then heated to harden the applied polyimide resin. Consequently, as shown in FIG. 2, a resin layer 12 is formed on the upper surface of the ceramic substrate 10. A resin layer 14 is formed on the lower surface of the ceramic substrate 10. The resin layers 12 and 14 having thickness equal to or smaller than 5 μm are formed.

Figure 3:
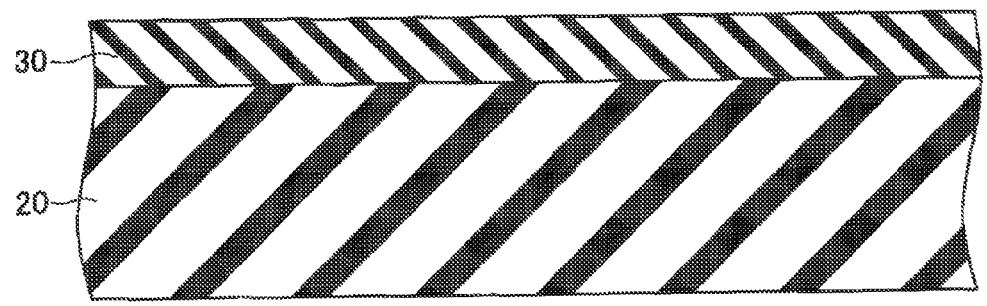
FIG. 3 is a longitudinal sectional view of a reinforcing plate 20 after implementation of step S4.

In step S4, resin is applied to an upper surface of a reinforcing plate 20 prepared separately from the ceramic substrate 10 to form a sacrifice layer 30 as shown in FIG. 3. The sacrifice layer 30 having thickness of 0.5 to 10 μm is formed. Note that, at this stage, the sacrifice layer 30 has viscosity. The reinforcing plate 20 is a substrate having hardness enough for being appropriately cut. The reinforcing plate 20 has translucency. Further, the reinforcing plate 20 is porous. That is, a large number of pores are formed in the reinforcing plate 20. The pores are connected to one another. Fluid can flow from an upper surface to a lower surface of the reinforcing plate 20 through these pores. The sacrifice layer 30 is thermosetting resin.

Figure 4:
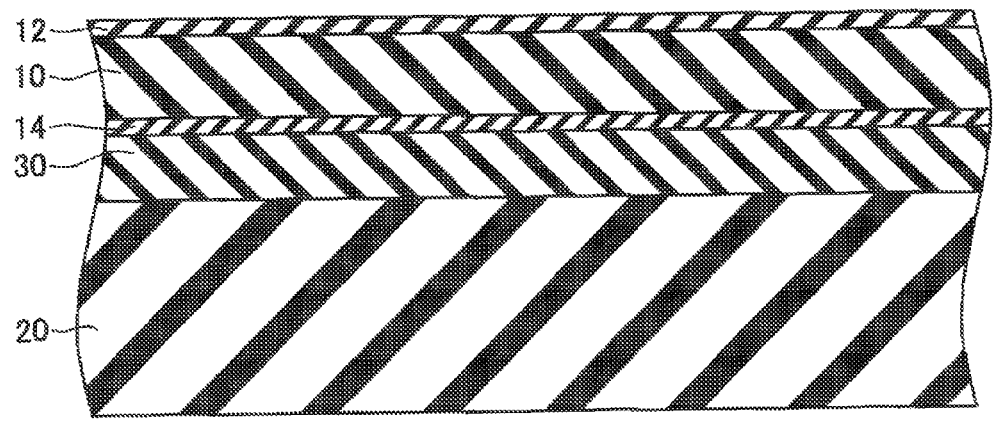
FIG. 4 is a longitudinal sectional view of a laminated body 60 after implementation of step S6.

In step S6, as shown in FIG. 4, the ceramic substrate 10 is stuck to the reinforcing plate 20 to form a laminated body 60 so that the resin layer 14 is in contact with a sacrifice layer 30. The laminated body 60 of reinforcing plate 20 and the ceramic substrate 10 is heated to harden the sacrifice layer 30. Consequently, the ceramic substrate 10 is adhered to the reinforcing plate 20. Note that, when the sacrifice layer 30 is hardened, a solvent included in the sacrifice layer 30 vaporizes and gas is generated. In heat treatment in step S6, the gas generated from the sacrifice layer 30 is emitted to an outside through the pores in the reinforcing plate 20. Consequently, deformation of the ceramic substrate 10 and a crack that occurs in the ceramic substrate 10 due to pressure of the gas generated in the sacrifice layer 30 are prevented.

Figure 5:
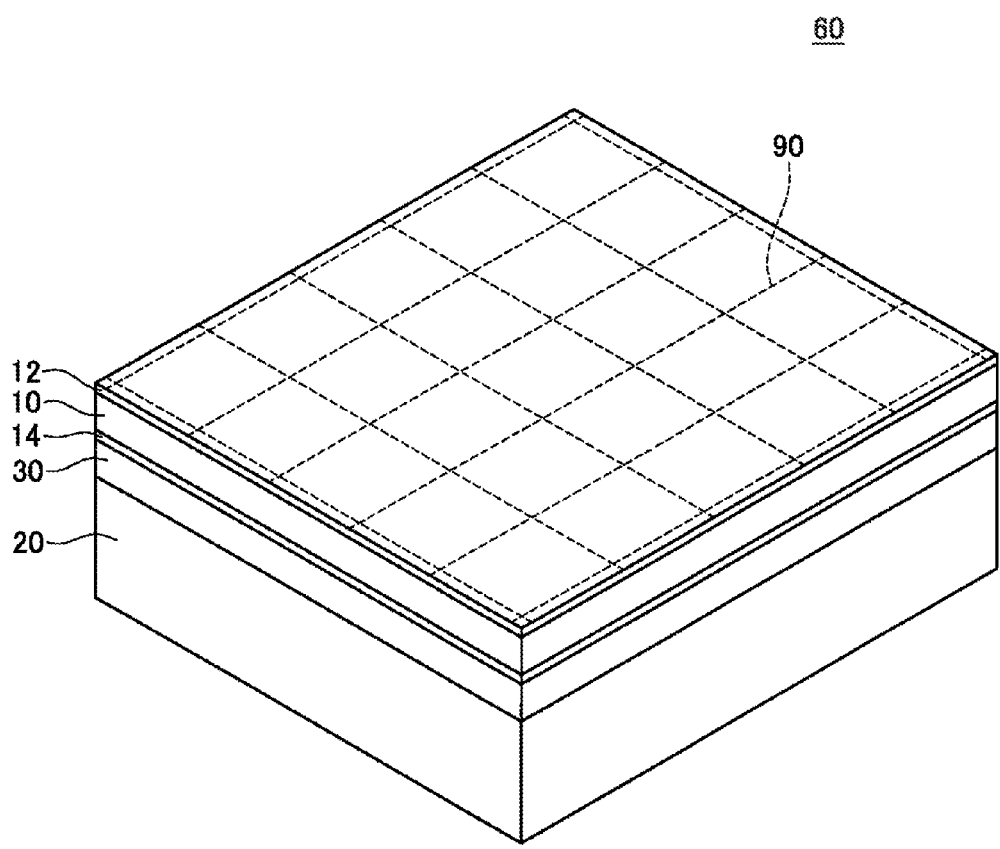
FIG. 5 is a perspective view of the laminated body 60 showing dicing lines 90.
Figure 6:
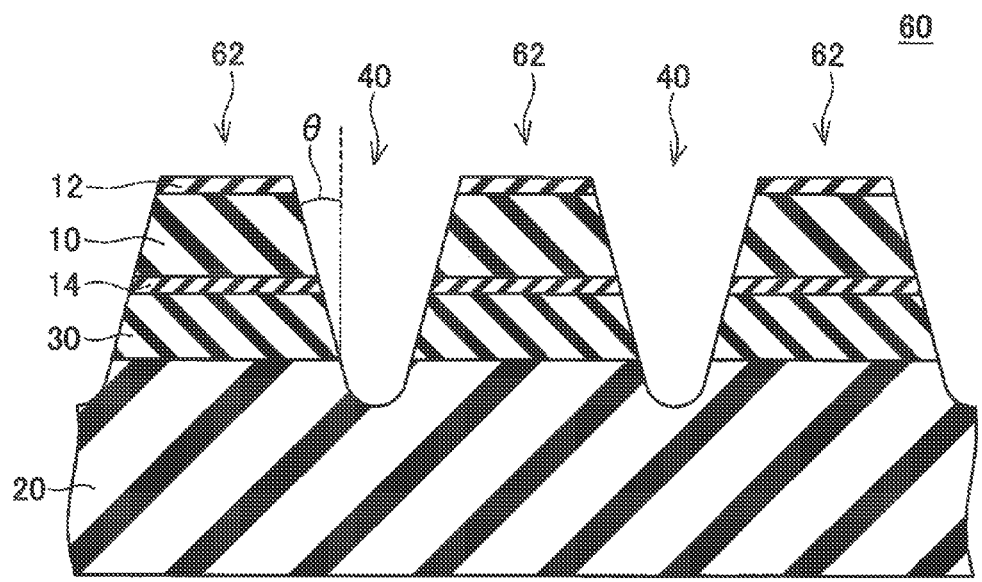
FIG. 6 is a longitudinal sectional view of the laminated body 60 after implementation of step S8.
Figure 7:
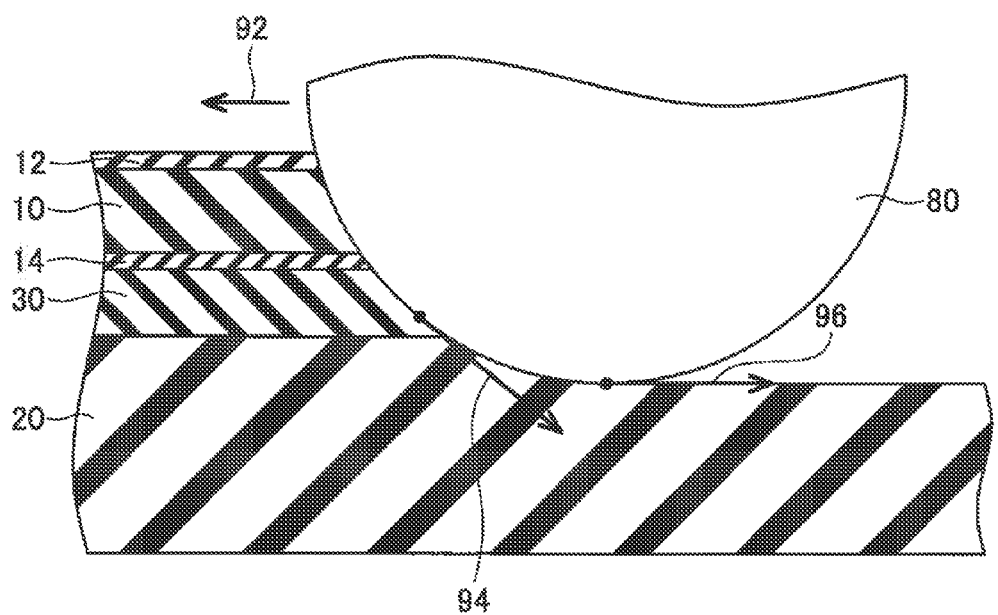
FIG. 7 is a longitudinal sectional view of the laminated body 60 in a direction extending along the dicing line during dicing.

In step S8, the ceramic substrate 10 is diced along dicing lines 90 indicated by a broken line in FIG. 5. As shown in FIG. 6, grooves 40 penetrating the ceramic substrate 10 and the sacrifice layer 30 from the upper surface of the ceramic substrate 10 and reaching the reinforcing plate 20 are formed along the dicing lines 90. Consequently, the ceramic substrate 10 is divided into plural ceramic devices 62. FIG. 7 shows a longitudinal cross section taken along the dicing line of the laminated body 60 during the dicing. As shown in the figure, during the dicing, a dicing blade 80 moves in a direction indicated by an arrow 92 while rotating, whereby the laminated body 60 is cut. In this embodiment, since the grooves 40 reaching the reinforcing plate 20 are formed, a lower end of the dicing blade 80 is located in the reinforcing plate 20. When the laminated body 60 is cut in this way, in a portion where the sacrifice layer 30 is cut, a moving direction 94 (a moving direction in a peripheral direction) of an edge at an outer peripheral end of the dicing blade 80 is not parallel to a moving direction 92 of the dicing blade 80 itself. Therefore, it is possible to suitably cut the sacrifice layer 30. In a portion where the reinforcing plate 20 is cut, a moving direction 96 of the edge at the outer peripheral end of the dicing blade 80 is parallel to the moving direction 92 of the dicing blade 80 itself. However, since the reinforcing plate 20 is harder than the sacrifice layer 30 and has the hardness suitable for cutting, a cut surface of the reinforcing plate 20 is suppressed from being roughened. When the reinforcing plate 20 is cut, the edge of the dicing blade 80 is dressed. Consequently, the edge of the dicing blade 80 is suppressed from being clogged up by resin (chips of the sacrifice layer 30, etc.). Therefore, a reduction of cutting ability of the dicing blade 80 is suppressed. Further, when the grooves 40 are formed to reach the hard reinforcing plate 20, since vibration of the dicing blade 80 is reduced, it is also possible to suppress occurrence of chipping on the surface of the ceramic substrate 10. Therefore, in step S8, it is possible to form the grooves 40 having smoother inner surfaces than in the conventional technique. Note that all of the resin layers 12, 14 and the sacrifice layer 30 are configured by resin that is not deteriorated by cutting fluid used during the dicing. When the grooves 40 are formed in this way, side surfaces of the grooves 40 slightly incline because of an influence of run-out of a dicing saw. That is, the grooves 40 are formed in a taper shape having larger width on an upper side. Grooves, a taper angle (an angle θ in FIG. 6) of side surfaces of which is equal to or larger than 1.5° and width of an upper end of which is 0.01 to 0.15 mm, are formed.

Figure 8:
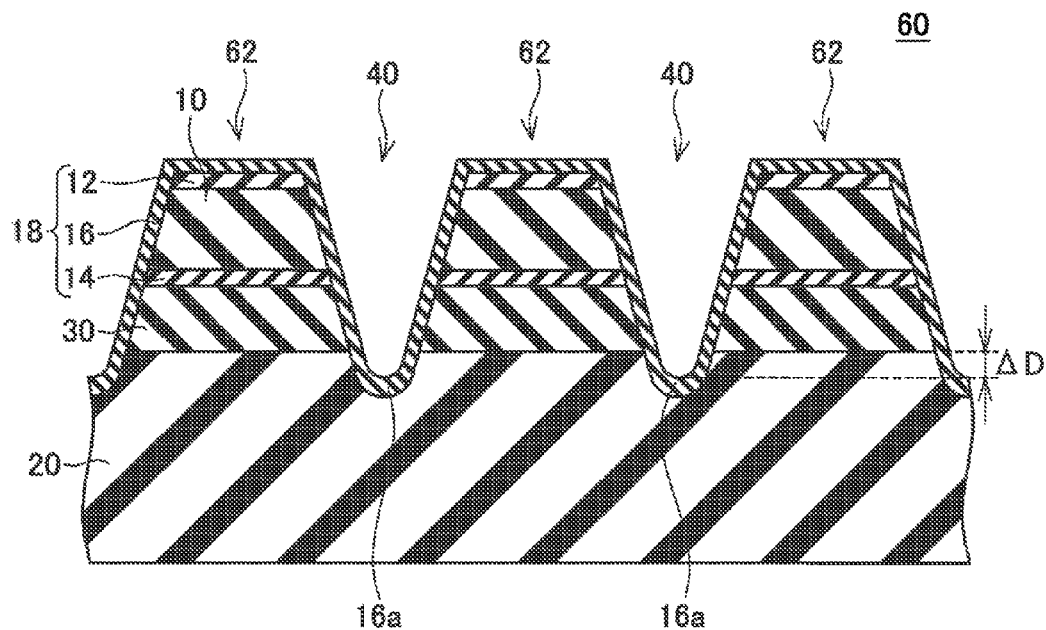
FIG. 8 is a longitudinal sectional view of the laminated body 60 after implementation of step S10.

In step S10, polyimide resin is applied to an upper surface of the laminated body 60. Photosensitive polyimide resin of a positive type having a characteristic to change property to be dissolved by an arbitrary solvent after receiving irradiation of light having a specific wavelength is applied herein. When the polyimide resin is applied to the upper surface of the laminated body 60, the inner surfaces of the grooves 40 are also covered with the polyimide resin. Subsequently, the laminated body 60 is heated to dry the applied polyimide resin. Consequently, as shown in FIG. 8, a resin layer 16 covering the surface of the laminated body 60 is formed. Note that, when the polyimide resin is applied, the polyimide resin accumulates on bottom surfaces of the grooves 40. Therefore, as shown in FIG. 8, resin layers 16a on the bottom surfaces of the grooves 40 are thick. The resin layer 16 for coating the side surfaces of the grooves 40 is thick in positions close to the resin layers 16a on the bottom surfaces. In step S10, as shown in FIG. 8, upper surfaces of the resin layers 16a on the bottom surfaces of the grooves 40 are located at a lower side than a lower surface of the sacrifice layer 30 to secure a distance ΔD between the upper surfaces and the bottom surface. Consequently, the resin layer 16 on the side surfaces of the sacrifice layer 30 is suppressed from becoming thick. Here, the resin layer 16 having thickness equal to or smaller than 5 μm in portions other than the bottom surfaces of the grooves 40 is formed. Note that the resin layer 16 is configured by resin of a type same as the resin layers 12 and 14. Therefore, in the following explanation, the resin layers 12 to 16 are collectively referred to as resin layer 18.

Figure 9:
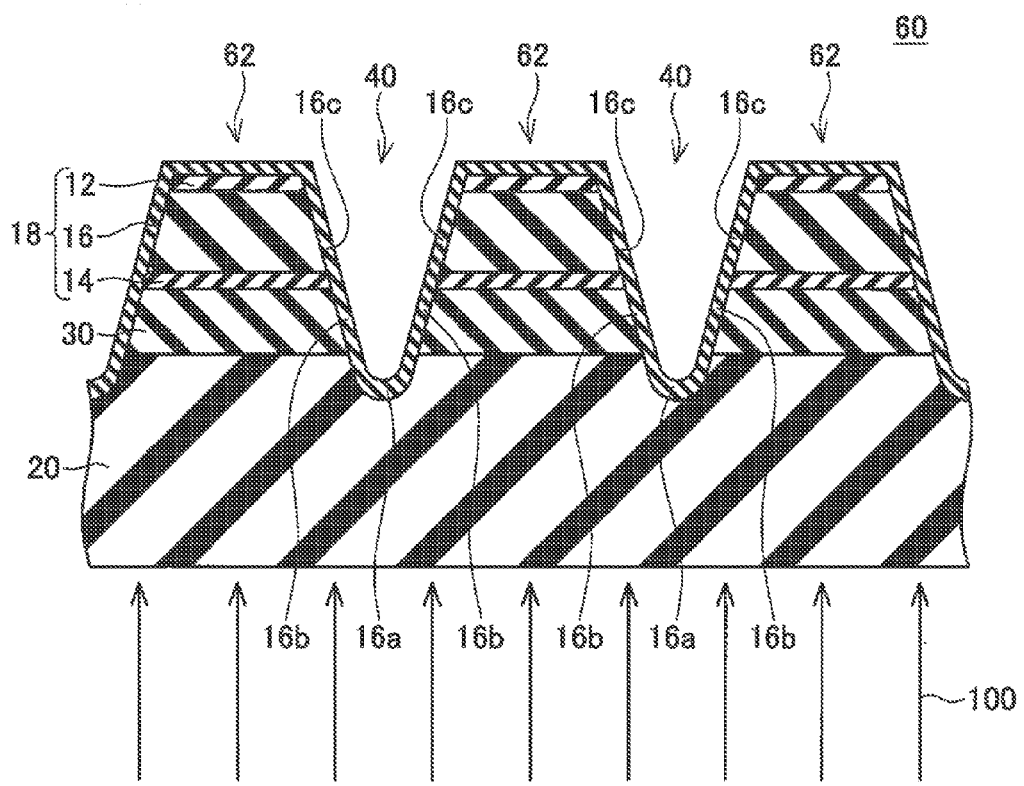
FIG. 9 is a longitudinal sectional view of the laminated body 60 showing a light irradiating method in step S12.

In step S12, as indicated by arrows 100 in FIG. 9, light having wavelength for changing a property of the resin layer 16 is irradiated toward the lower surface of the reinforcing plate 20. Since the reinforcing plate 20 has translucency, the light transmitted through the reinforcing plate 20 is irradiated to the resin layers 16a that cover the bottom surfaces of the grooves 40. The irradiated light reaches the resin layer 16 (resin layers indicated by reference numeral 16b in FIG. 9) that covers the side surfaces of the sacrifice layer 30. Consequently, the resin layers 16a and 16b change in their property. On the other hand, the light is not irradiated to the resin layer 16 in portions covering the side surfaces of the ceramic substrate 10 (resin layers indicated by reference numeral 16c in FIG. 9). This is because, since the grooves 40 are formed in the taper shape, the sacrifice layer 30 functions as a mask. Therefore, the resin layers 16c do not change in their property. Note that a range irradiated by the light changes according to intensity of the irradiated light and a shape of the grooves 40 (depth of the grooves, an angle of side surfaces of the grooves, etc.). In this embodiment, the intensity of the light and the shape of the tranches 40 are adjusted so that the light is irradiated to the resin layers 16a and 16b and not irradiated to the resin layer 16 other than the resin layers 16a and 16b.

Figure 10:
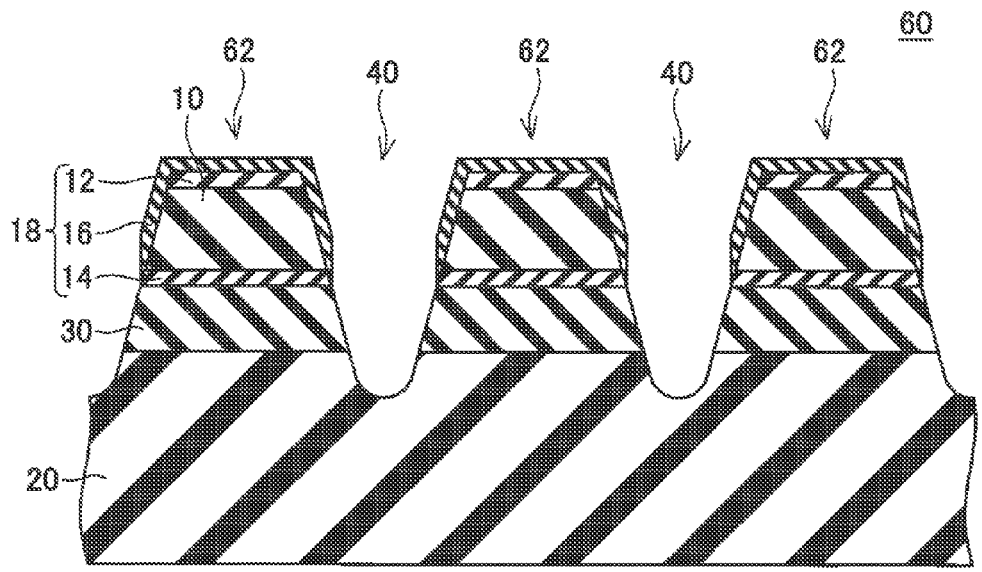
FIG. 10 is a longitudinal sectional view of the laminated body 60 after implementation of step S14.

In step S14, as shown in FIG. 10, the resin layers 16b on the side surfaces of the sacrifice layer 30 are removed by a solvent that can selectively dissolve only the resin layers 16a and 16b having the changed property. In FIG. 10, although the resin layers 16a on the bottom surfaces of the grooves 40 are also removed, since the resin layers 16a on the bottom surfaces of the grooves 40 are thick, it is unnecessary to completely remove the resin layers 16a. Since the distance ΔD is secured in step S10 as explained above, the resin layers 16b on the side surfaces of the sacrifice layer 30 are formed thin. Therefore, in step S14, the resin layers 16b can be removed in a short time. Therefore, damage to the resin layer 16 having the unchanged property is suppressed. After the resin layers 16b are removed, the laminated body 60 is heated to harden (stabilize) the remaining resin layer 16.

In step S16, a characteristic and an external appearance of the ceramic devices 62 are inspected.

Figure 11:
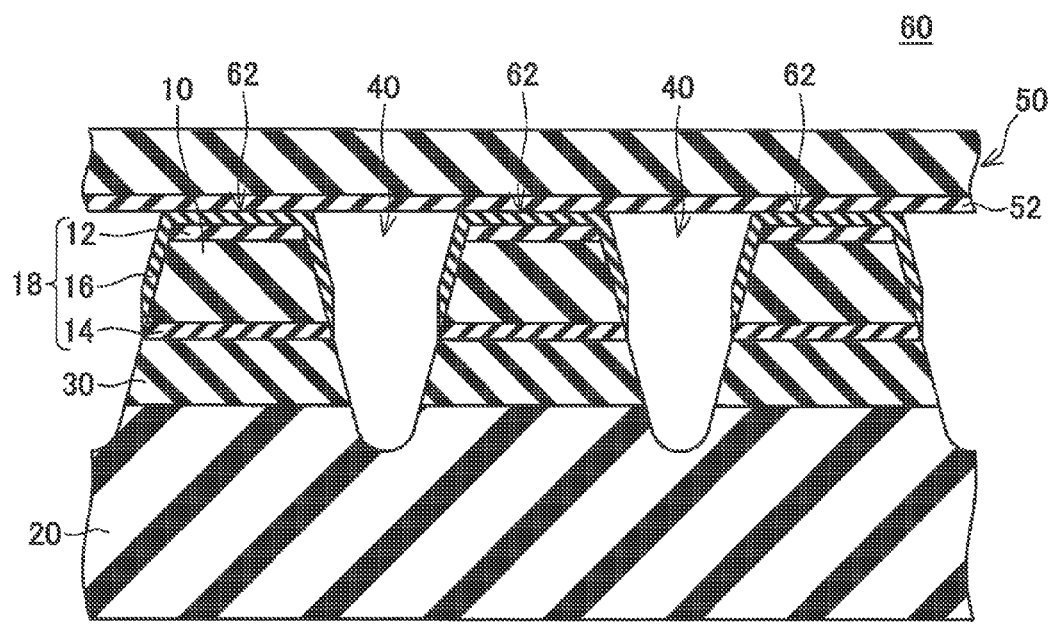
FIG. 11 is a longitudinal sectional view of the laminated body 60 after sticking of a carrier film 50.
Figure 12:
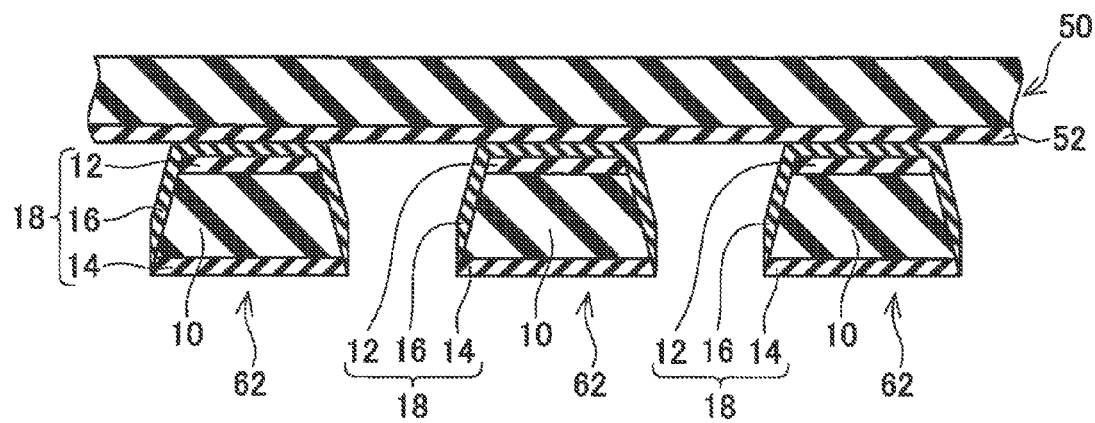
FIG. 12 is a longitudinal sectional view of a ceramic device 62 separated from the reinforcing plate 20.

In step S18, first, as shown in FIG. 11, a carrier film 50 having an adhesive layer 52 on a surface thereof is stuck to the upper surface of the laminated body 60. Note that the adhesive layer 52 is an adhesive layer, adhesiveness of which is deteriorated by UV irradiation, heating, cooling, or the like. Subsequently, the laminated body 60 is immersed in a solution for selectively dissolving the sacrifice layer 30. Then, the solution enters in the grooves 40. Since the resin layers 16b on the side surfaces of the sacrifice layer 30 are removed, the sacrifice layer 30 is dissolved from the side surfaces of the sacrifice layer 30. Consequently, the sacrifice layer 30 is removed. After the sacrifice layer 30 is removed, the ceramic devices 62 are separated from the reinforcing plate 20. Consequently, the ceramic device 62 is completed as shown in FIG. 12. The solution used at this point is a solution that selectively dissolves only the sacrifice layer 30. The other layers such as the resin layer 18 are not dissolved in the solution or dissolving speed of the resin layer 18 is markedly lower than dissolving speed of the sacrifice layer 30.

As explained above, with the manufacturing method according to the first embodiment, it is possible to form the grooves 40 having the smooth inner surfaces. Therefore, foreign matters are absent on the inner surfaces of the grooves 40. When the resin coating in step S10 is carried out, it is suppressed for foreign matters to be caught in the resin. According to this technique, it is possible to suitably perform the resin coating. With the manufacturing method according to the first embodiment, it is possible to manufacture the ceramic device 62, entire six surfaces of which are covered with the resin layer 18. Therefore, it is possible to further improve reliability of the ceramic device 62.

In the manufacturing method according to the first embodiment, the resin layer 16 is formed so that the upper surfaces of the resin layers 16a, which cover the bottom surfaces of the grooves 40, are located at the lower side than the lower surface of the sacrifice layer 30 (i.e., the distance ΔD in FIG. 8 is secured). Therefore, the resin layers 16b on the side surfaces of the sacrifice layer 30 are suppressed from becoming thick. The damage to the resin layers having the unchanged property (i.e., the resin layers that coat the surfaces of the ceramic device 62) is suppressed when the resin layers 16b are removed.

In the first embodiment explained above, the resin layers 16b having the changed property are removed in step S14. However, when the resin layers 16b are deteriorated to a degree for allowing the liquid to penetrate through the resin layers 16b in step S12, step S14 does not have to be performed. In this case, step S18 is performed in a state in which the deteriorated resin layers 16b are present. In step S18, since the solution penetrates through the resin layers 16b, the sacrifice layer 30 can be dissolved.

In the first embodiment, for a purpose of securing an escape route for the gas in step S6, the porous reinforcing plate 20 is used. However, as in an embodiment explained below, when the problem of the gas is solved by another measure, the reinforcing plate 20 does not need to be porous.

Figure 13:
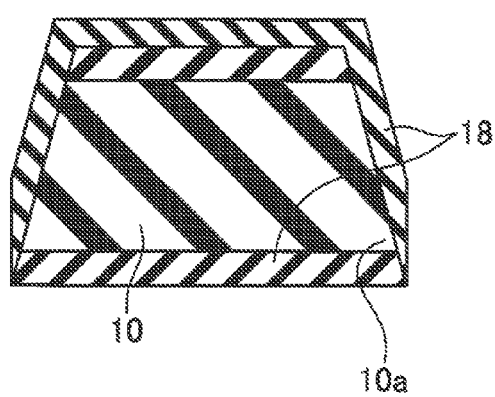
FIG. 13 is an enlarged sectional view of the ceramic device.

FIG. 13 shows an enlarged sectional view of a ceramic device manufactured by the manufacturing method according to the first embodiment. In the manufacturing method according to the first embodiment, the resin layers 16b on the side surfaces of the sacrifice layer 30 can be substantially completely removed. Therefore, the resin layer 18 does not project to a lower side in an edge portion 10a on a lower side of the ceramic device. Therefore, a part of the resin layer 18 less easily exfoliates. Foreign matters are suppressed from being caused by the exfoliation of the resin layer 18, for example, during mounting of the ceramic device 10.

Second Embodiment

Figure 14:
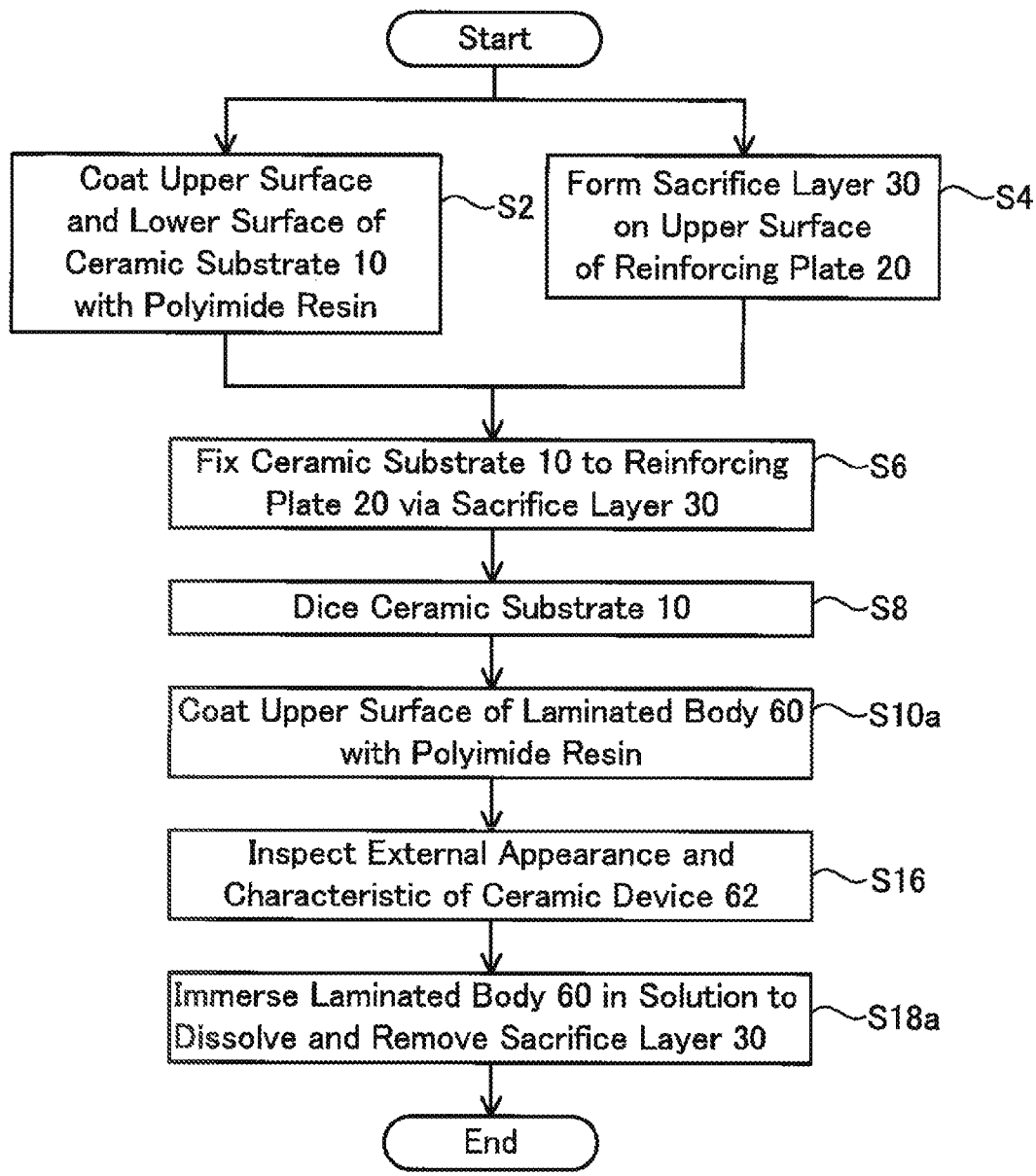
FIG. 14 is a flowchart for explaining a manufacturing method according to a second embodiment.

A manufacturing method according to a second embodiment is explained. FIG. 14 is a flowchart for explaining the manufacturing method according to this embodiment.

Step S2 is implemented in the same manner as step S2 in the first embodiment.

In step S4, as in step S4 in the first embodiment, the sacrifice layer 30 is formed on the upper surface of the reinforcing plate 20. Note that, in the manufacturing method according to the second embodiment, the porous reinforcing plate 20 is used. The reinforcing plate 20 used herein is porous with porosity of 20 to 50%. That is, a large number of pores having Φ0.08 mm or less are formed in the reinforcing plate 20. The pores are connected to one another. Fluid can flow from the upper surface to the lower surface of the reinforcing plate 20 through the pores. In the second embodiment, the reinforcing plate 20 does not need to have translucency.

Steps S6 to S8 are implemented in the same manner as steps S6 to S8 in the first embodiment.

In step S10a, as in step S10 in the first embodiment, the surface of the laminated body 60 is coated with polyimide resin and the polyimide resin is hardened to form the resin layer 16. At this point, as in step S10 in the first embodiment, the distance ΔD is secured between the resin layers 16a on the bottom surfaces of the tranches 40 and the lower surface of the sacrifice layer 30 (see FIG. 8). Consequently, the resin layer 16 on the side surfaces of the sacrifice layer 30 is suppressed from becoming thick. Note that, in the second embodiment, the polyimide resin does not need to have photosensitivity.

In step S16, a characteristic and an external appearance of the ceramic devices 62 are inspected.

Figure 15:
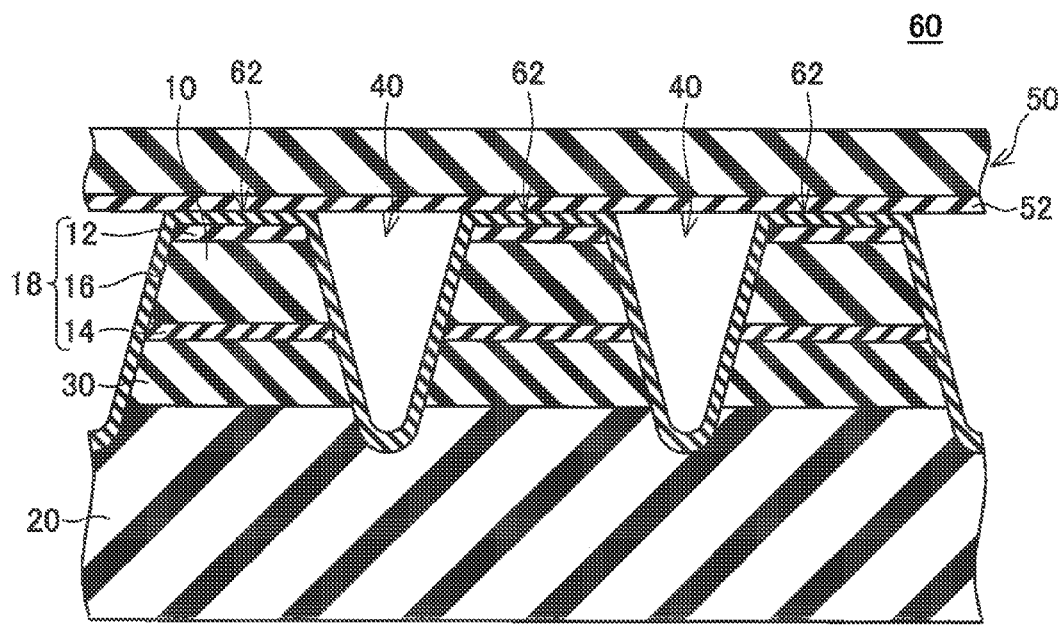
FIG. 15 is a longitudinal sectional view of the laminated body 60 after sticking of the carrier film 50.
Figure 16:
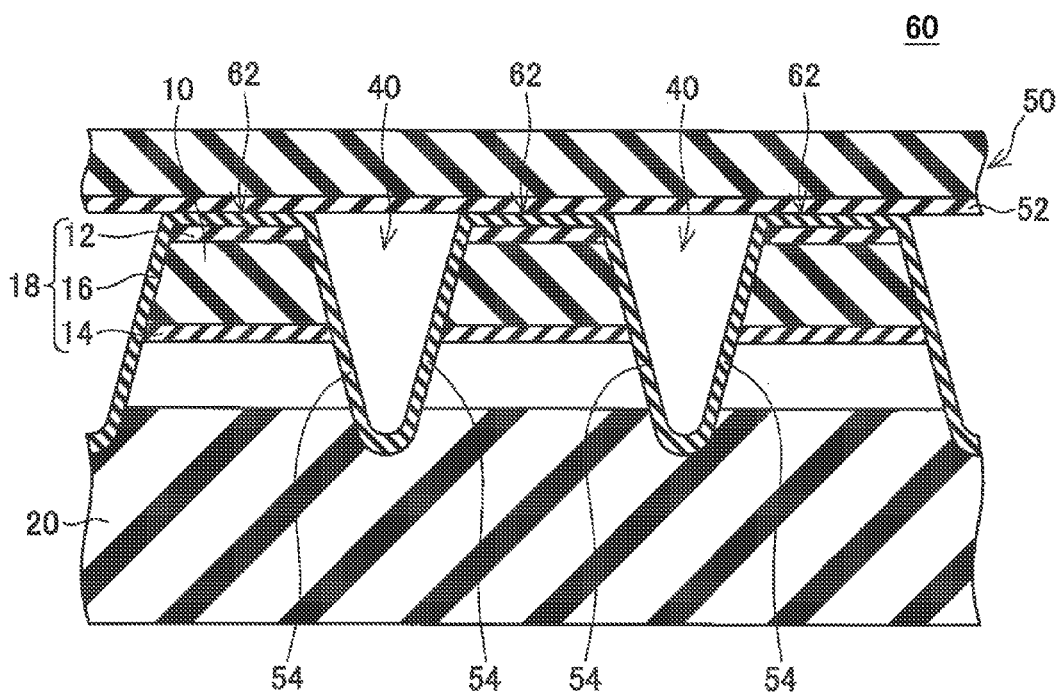
FIG. 16 is a longitudinal sectional view of the laminated body 60 after removal of a sacrifice layer 30.

In step S18a, as in step S18 in the first embodiment, as shown in FIG. 15, the carrier film 50 having the adhesive layer 52 on the surface thereof is stuck to the upper surface of the laminated body 60. Subsequently, a solution for selectively dissolving the sacrifice layer 30 is caused to penetrate through the pores of the reinforcing plate 20. Consequently, the solution is caused to reach the sacrifice layer 30 through the pores of the reinforcing plate 20 and dissolve the sacrifice layer 30. Note that the solution used at this point is a solution for selectively dissolving only the sacrifice layer 30. The other layers such as the resin layer 18 are not dissolved in the solution or a dissolution rate is markedly lower than a dissolution rate of the sacrifice layer 30. In step S18a, as shown in FIG. 16, the sacrifice layer 30 is completely removed. Note that, in a state shown in FIG. 16, the ceramic device 62 and the reinforcing plate 20 are connected by portions 54 that had covered the side surfaces of the sacrifice layer 30 in the resin layer 16. However, since the distance ΔD is secured in the step S10a, a thickness of the connecting portions 54 in FIG. 16 is small. Therefore, the connecting portions 54 of the resin layer 16 are cut by weight of the reinforcing plate 20 during the dissolution of the sacrifice layer 30. However, when the resin layer 16 is relatively thick (e.g., about 1 to 5 μm) and the connecting portions 54 of the resin layer 16 is not cut by own weight of the reinforcing plate 20, the connecting portions 54 can be cut by mechanical vibration of ultrasound or the like or a thermal expansion difference due to heating. With the configuration explained above, as shown in FIG. 12, the ceramic device 62, the entire surface of which is covered with the resin layer 18, is obtained.

As explained above, with the manufacturing method according to the second embodiment, as in the first embodiment, it is possible to manufacture the ceramic device 62, entire six surfaces of which are covered with the resin layer 18.

Third Embodiment

Figure 17:
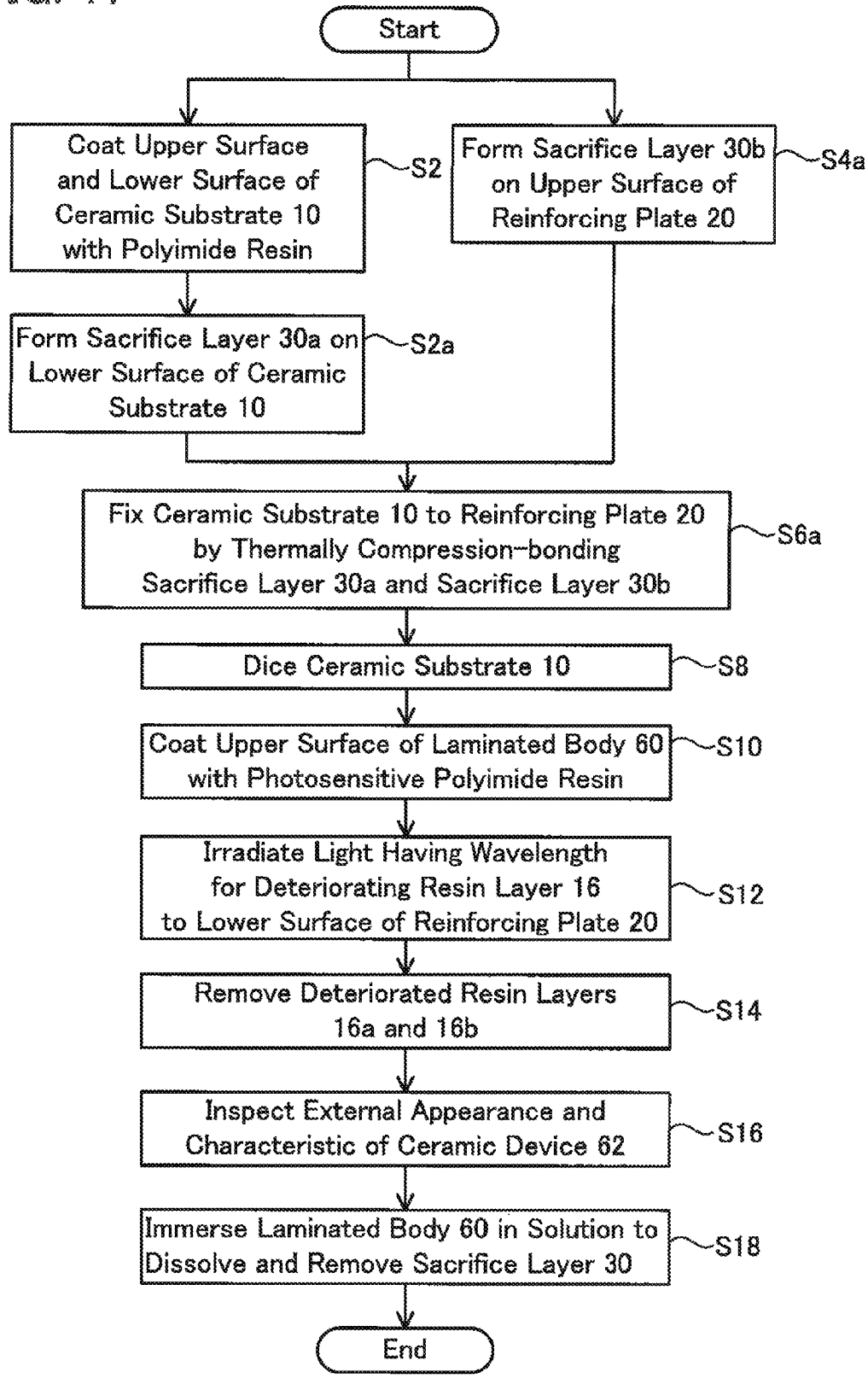
FIG. 17 is a flowchart for explaining a manufacturing method according to a third embodiment.

A manufacturing method according to a third embodiment is explained. FIG. 17 is a flowchart for explaining the manufacturing method according to the third embodiment.

In step S2, as in step S2 in the first embodiment, the resin layers 12 and 14 are formed on the upper surface and the lower surface of the ceramic substrate 10.

Figure 18:
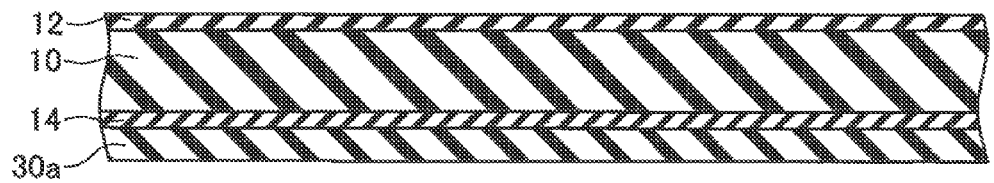

In step S2a, resin is applied to the lower surface of the ceramic substrate 10 to form a sacrifice layer 30a as shown in FIG. 18. The sacrifice layer 30a having thickness of 0.5 to 10 μm is formed. Subsequently, the ceramic substrate 10 is heated to dry the sacrifice layer 30a.

Figure 19:
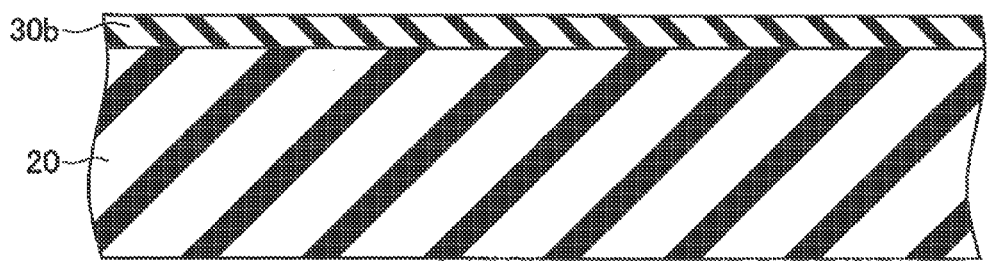

In step S4a, resin is applied to the upper surface of the reinforcing plate 20 to form a sacrifice layer 30b as shown in FIG. 19. The sacrifice layer 30b having thickness of 0.5 to 10 μm is formed. In step S4a, unlike step S4 in the first embodiment, the reinforcing plate 20 is heated to dry the sacrifice layer 30b.

Figure 20:
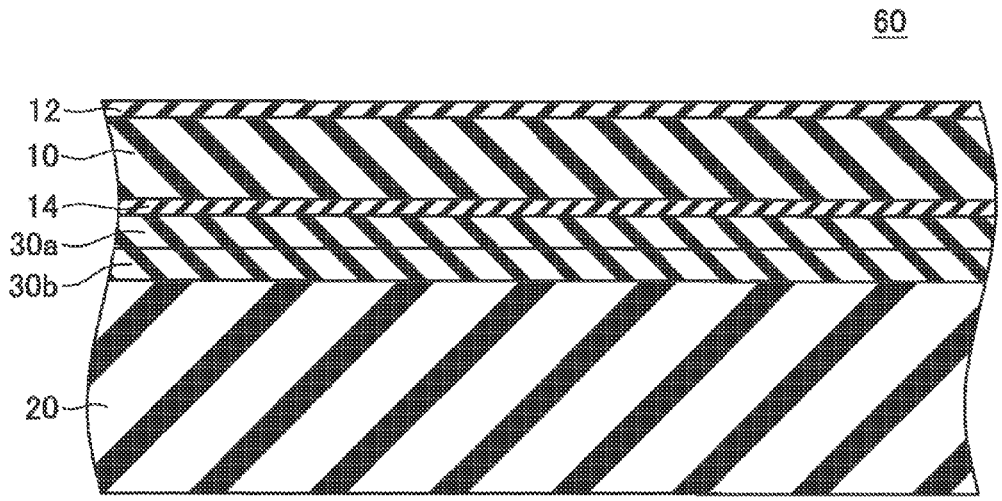

In step S6a, in a decompressed atmosphere, as shown in FIG. 20, the ceramic substrate 10 and the reinforcing plate 20 are laminated so that the sacrifice layer 30a and the sacrifice layer 30b are in contact with each other. Since the ceramic substrate 10 and the reinforcing plate 20 are laminated in the decompressed atmosphere in this way, it is possible to prevent an air layer from being formed between the sacrifice layer 30a and the sacrifice layer 30b. Alternatively, in step S6a, after the ceramic substrate 10 and the reinforcing plate 20 are stacked so that the sacrifice layer 30a and the sacrifice layer 30b are in contact with each other, these can be pressurized and heated. While the ceramic substrate 10 and the reinforcing plate 20 are heated by a hot plate, the ceramic substrate 10 may be pressurized toward the reinforcing plate 20 to push out air by moving a squeegee or a rubber roller in one direction. With such a method, it is also possible to prevent the air layer from being formed between the sacrifice layer 30a and the sacrifice layer 30b. Subsequently, the laminated body 60 is pressurized in a thickness direction and heated. Consequently, the sacrifice layer 30a and the sacrifice layer 30b are thermally compression-bonded and, at the same time, thermally hardened. The already-dried sacrifice layers 30a and 30b are thermally compression-bonded in this way. Consequently, gas is prevented from being generated from the sacrifice layers, and the ceramic substrate 10 is prevented from being deformed and prevented from being cracked by pressure of the gas.

Subsequent steps S8 to S18 are implemented in the same manner as in the manufacturing method according to the first embodiment.

Fourth Embodiment

Figure 21:
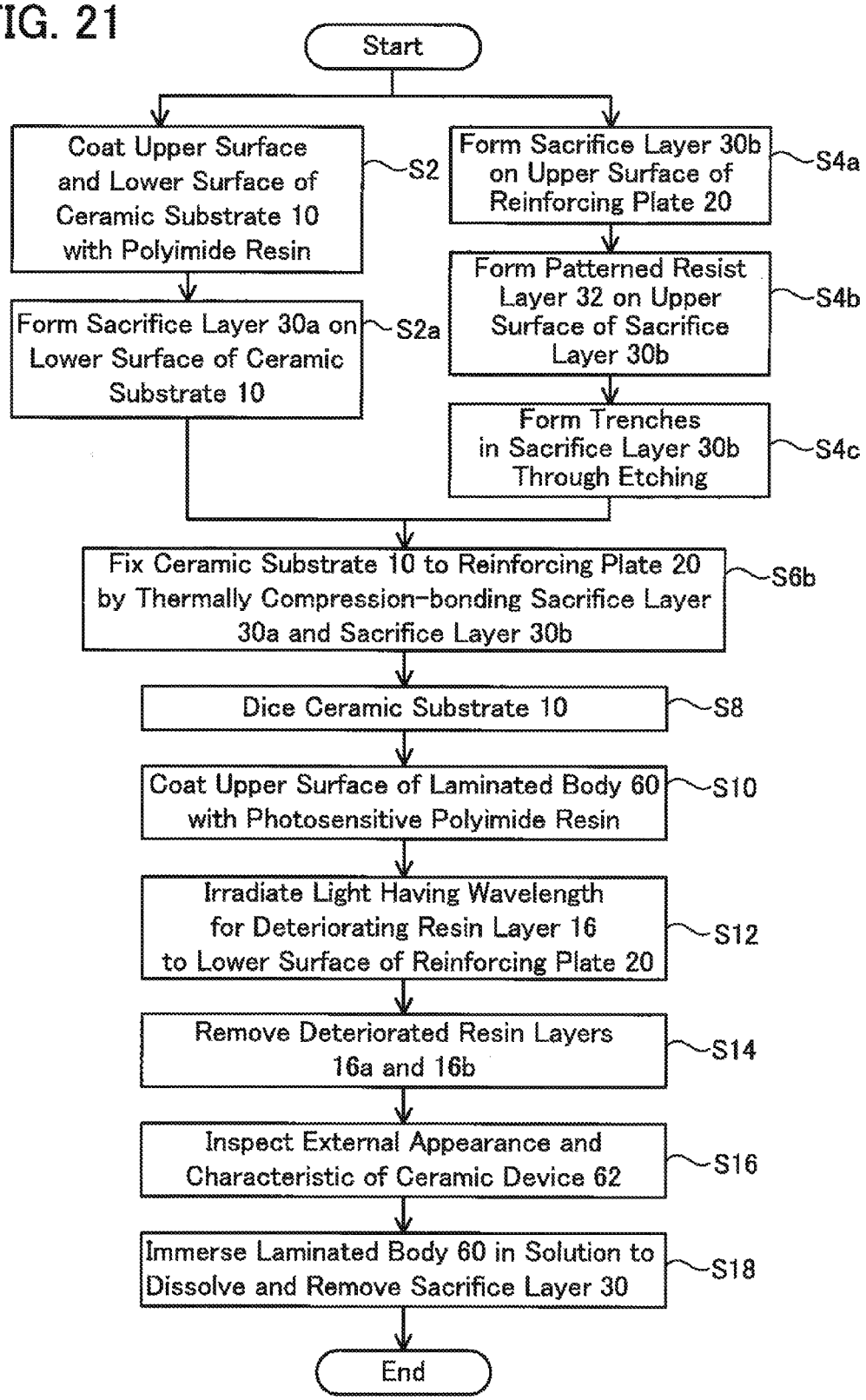
FIG. 21 is a flowchart for explaining a manufacturing method according to a fourth embodiment.

A manufacturing method according to a fourth embodiment is explained. FIG. 21 is a flowchart for explaining the manufacturing method according to this embodiment.

Steps S2, S2a, and S4a are implemented in the same manner as in the manufacturing method according to the third embodiment.

Figure 22:
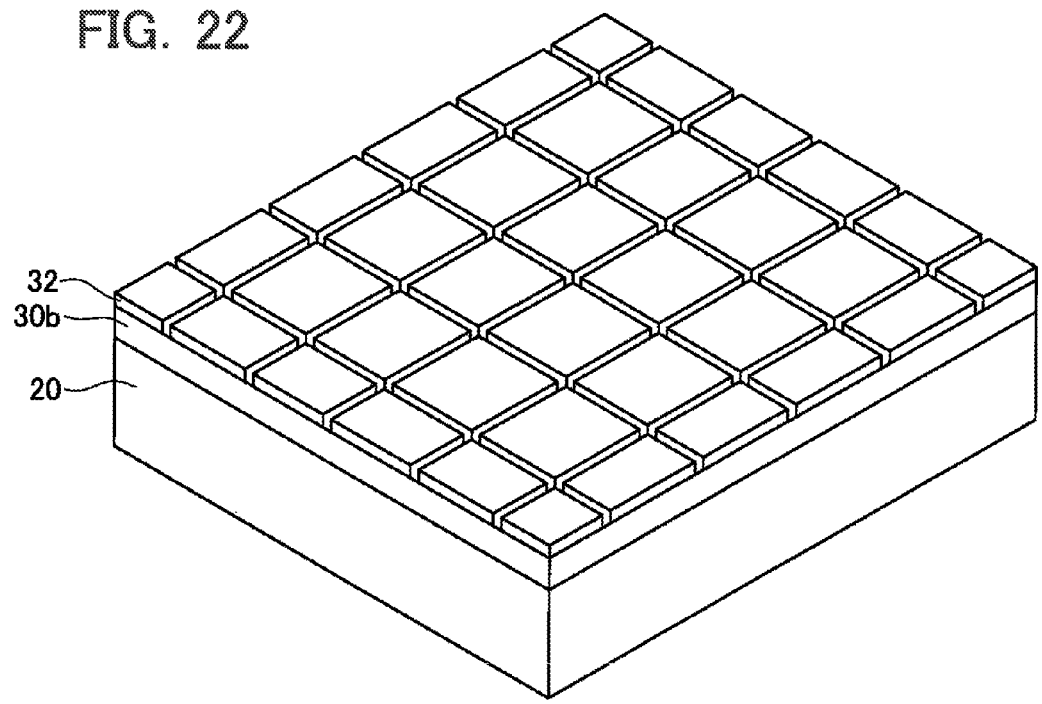
FIG. 22 is a perspective view of the reinforcing plate 20 after implementation of step S4b.

In step S4b, a resist layer 32 is formed on a surface of the sacrifice layer 30b on the reinforcing plate 20. Thereafter, as shown in FIG. 22, the resist layer 32 is patterned in a lattice shape.

Figure 23:
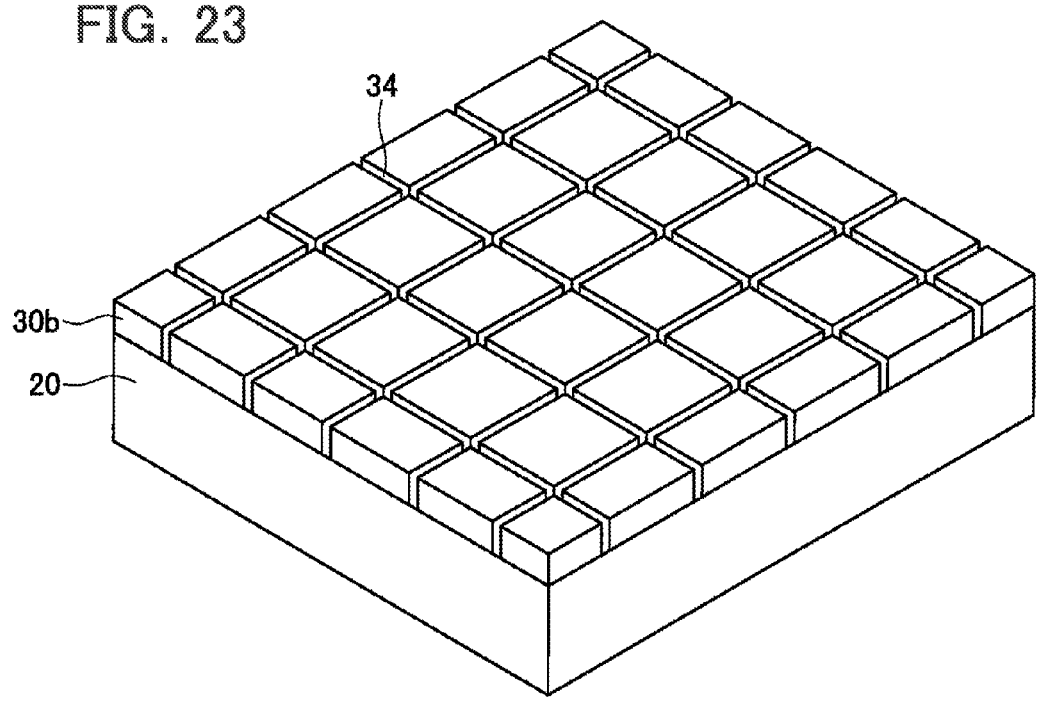
FIG. 23 is a perspective view of the reinforcing plate 20 after implementation of step S4c.

In step S4c, the sacrifice layer 30b is etched using the resist layer 32 formed in step S4b as a mask. Thereafter, the resist layer 32 is removed. Consequently, as shown in FIG. 23, grooves 34 extending in the lattice shape are formed on the surface of the sacrifice layer 30b.

In step S6b, the ceramic substrate 10 and the reinforcing plate 20 are laminated so that the sacrifice layer 30a and the sacrifice layer 30b are in contact with each other. The laminated body 60 is pressurized in a thickness direction and heated. Consequently, the sacrifice layer 30a and the sacrifice layer 30b are thermally compression-bonded and, at the same time, thermally hardened. Note that, when the ceramic substrate 10 and the reinforcing plate 20 are laminated, the grooves 34 formed in step S4c function as an escape route for air. Therefore, an air layer is prevented from being formed between the sacrifice layer 30a and the sacrifice layer 30b during the lamination. As explained above, in the manufacturing method according to the fourth embodiment, a compression bonding step can be implemented without generating a decompressed atmosphere. Therefore, it is possible to simplify manufacturing equipment. In this manufacturing method, as in the manufacturing method according to the third embodiment, gas is prevented from being generated from the sacrifice layers. Therefore, the ceramic substrate 10 is prevented from being deformed and prevented from being cracked by pressure of the gas.

Subsequent steps S8 to S18 are implemented in the same manner as in the manufacturing method according to the first embodiment.

The techniques in the third embodiment and the fourth embodiment explained above can also be used in the process in which the ceramic substrate 10 is adhered to the reinforcing plate 20 in the second embodiment (the technique for causing the solution to penetrate through the porous reinforcing plate to dissolve the sacrifice layer).

In the third embodiment and the fourth embodiment, a resin layer made of a thermosetting resin sheet formed by resin different from the sacrifice layer may be used instead of the sacrifice layer 30b formed on the upper surface of the reinforcing plate 20. When the thermosetting sheet is used, first, at relatively low temperature of 70° C. to 100° C. which softens the thermosetting sheet, the sacrifice layer 30a is stuck to an upper surface of the thermosetting sheet and the reinforcing plate 20 is stuck to a lower surface of the reinforcing plate 20. Consequently, the thermosetting sheet and the sacrifice layer 30a are provisionally fixed and the thermosetting sheet and the reinforcing plate 20 are also provisionally fixed. Subsequently, a laminated body of the thermosetting sheet, sacrifice layer 30a, and the reinforcing plate 20 is subjected to heat treatment at high temperature of 180° C. to 230° C. to harden the thermosetting sheet. Consequently, the thermosetting sheet and the sacrifice layer 30a are adhered to each other and the thermosetting sheet and the reinforcing plate 20 are also adhered to each other. That is, the ceramic substrate 10 is fixed to the reinforcing plate 20. Note that it is preferable that the thermosetting sheet has a Young's modulus about the same as that of the sacrifice layer (e.g., 3 GPa or more) after the hardening and has a characteristic that the thermosetting sheet is stable even if being in contact with resin for coating the side surfaces of the grooves and is not decomposed in thermal treatment for hardening the resin for coating the side surfaces of the grooves. Thickness of the thermosetting sheet can be set to 5 to 100 μm. When a resin layer different from the sacrifice layer is formed as discussed above, only the sacrifice layer 30a is dissolved when the ceramic substrate 10 is separated from the reinforcing plate 20 (i.e., the resin layer (e.g., the thermosetting resin sheet) used instead of the sacrifice layer 30b remains on the surface of the reinforcing plate 20). When winding or a local bend is present on the surface of the ceramic substrate 10 or on the reinforcing plate 20, or when unevenness is present on the ceramic substrate 10, the thermosetting sheet is preferable. If the sacrifice layer 30a and the reinforcing plate 20 are connected via the thermosetting sheet, the thermosetting sheet functions as a buffer material and an air layer is prevented from being caught in a connecting portion. The distance ΔD only has to be secured at least between the resin layers 16a on the bottom surfaces of the tranches 40 and the lower surface of the sacrifice layer 30a.

Figure 24:
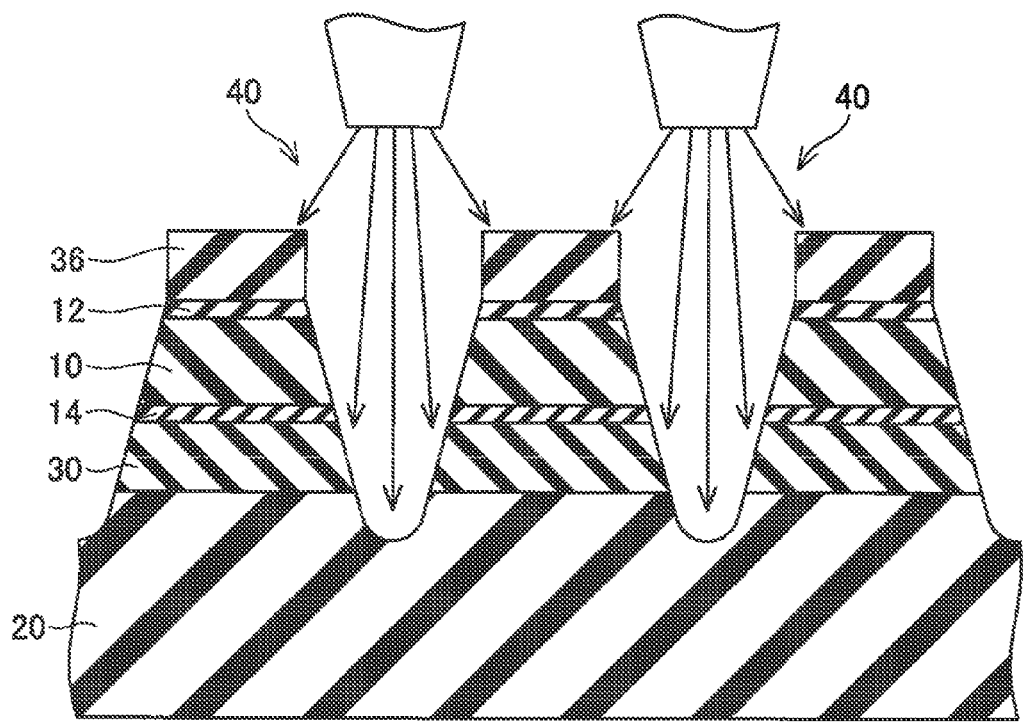
FIG. 24 is a longitudinal sectional view of the laminated body 60 during blasting.

In the first to fourth embodiments explained above, formation of a groove through blasting may be implemented in addition to the dicing in step S8. FIG. 24 shows formation of the grooves 40 through the blasting. When the blasting is used, first, a resist mask 36 is formed on a top surface of the ceramic substrate 10. Note that, in the resist mask 36, openings are provided in advance along dicing lines. As shown in FIG. 24, media are ejected to the openings to form the grooves 40 penetrating the ceramic substrate 10 and the sacrifice layer 30 and reaching the reinforcing plate 20. When the grooves 40 are formed by the blasting in this way, the grooves 40 are also formed in a taper shape having larger width on an upper side. When the grooves 40 penetrating the sacrifice layer 30 are formed in this way, the media are less easily caught in the sacrifice layer 30. Since the reinforcing plate 20 forming the bottom surfaces of the grooves 40 is hard, the media are also less easily caught in the reinforcing plate 20. Therefore, in a step after the formation of the grooves 40, the media are suppressed from falling off of inner surfaces of the grooves 40 to cause a failure.

In the first to fourth embodiments, before the sacrifice layer is removed, the resin layer 16 on the bottom surfaces of the grooves 40 may be removed by irradiating a laser.

In the first to fourth embodiments, an electrode may be already formed on the surface of the ceramic substrate 10 at start time of step S2.

In the first to fourth embodiments, the resin layers 12 and 14 are formed on both of the upper surface and the lower surface of the ceramic substrate 10 in step S2. However, a resin layer may be formed only on the lower surface. With such a configuration, it is also possible to form the ceramic device 62, entire six surfaces of which are covered with the resin layer. When it is unnecessary to coat the lower surface of the ceramic device 62 with resin, step S2 may be omitted.

In the first to fourth embodiments, cleaning by which chips generated during the dicing from the surface of the laminated body 60 are removed may be implemented between the dicing (i.e., step S8) and the resin coating (i.e., step S10). In the cleaning, cleaning may be performed using a solution capable of dissolving chips of the sacrifice layer. With the cleaning being implemented, in the resin coating, it is possible to prevent foreign matters from being caught in the resin layer 16. Consequently, it is possible to further improve reliability of the ceramic device 62.

Fifth Embodiment

Figure 25:
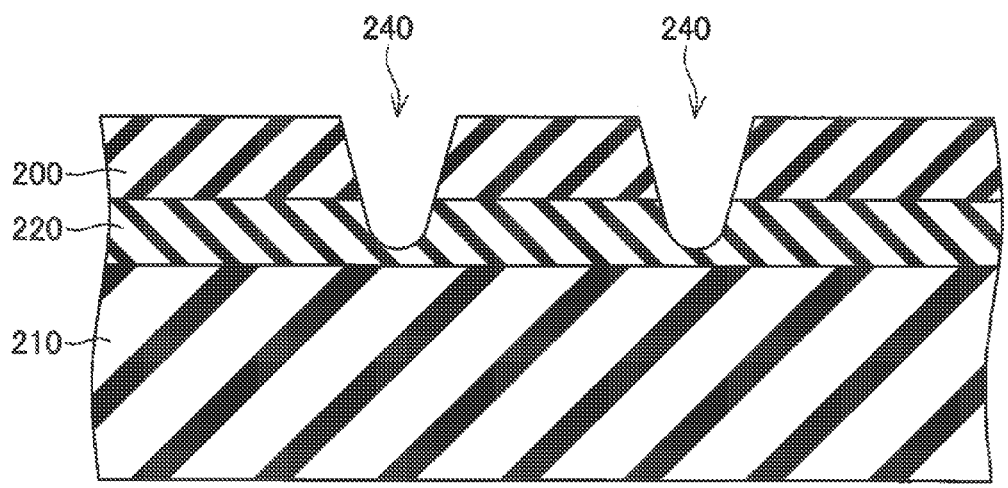
FIG. 25 is a sectional view of a laminated body for explaining a manufacturing method of a reference example 1.

In a manufacturing method according to a fifth embodiment, first, a lower surface of a ceramic substrate is coated with resin. Subsequently, the ceramic substrate is fixed to a reinforcing plate via a sacrifice layer. The ceramic substrate is fixed to the reinforcing plate so that a resin layer on the lower surface of the ceramic substrate is in contact with the sacrifice layer. As a method for fixing the ceramic substrate to the reinforcing plate via the sacrifice layer, the methods in the embodiments explained above may be used or other methods may be used. Resin in which a filler is dispersed is used as the sacrifice layer. That is, the filler is contained in the sacrifice layer in a dispersed state. The filler is particles harder than the resin in the sacrifice layer. Silica beads or the like can be used as the filler. After hardening, a glass transition temperature of the sacrifice layer is 80° C. or more and a Young's modulus of the sacrifice layer is 6 GPa or more. The resin in the sacrifice layer is preferably resin not having surface tackiness after hardening such as polyimide, epoxy, or mixed resin of polyimide and epoxy. Subsequently, as shown in FIG. 25, by dicing processing, grooves 240 penetrating a ceramic substrate 200 and reaching a sacrifice layer 220 are formed on an upper surface of a laminated body. However, the grooves 240 are formed not to reach a reinforcing plate 210. When the sacrifice layer has a characteristic that the glass transition temperature is 80° C. or more and the Young's modulus or 6 GPa or more, the sacrifice layer less easily changes its property even if being heated due to dicing. Therefore, chips are discharged from the grooves without being adhering to a ceramic substrate surface, and inner surfaces of the grooves are suppressed from being roughened. That is, with the method according to the fifth embodiment, even in forming grooves having their bottom surfaces present in the sacrifice layer, it is possible to form the grooves with smooth inner surfaces. Further, when the filler is present in the sacrifice layer, a dicing blade is dressed by the filler during dicing. An edge of the dicing blade is suppressed from being clogged up by the resin (chips of the sacrifice layer). In particular, when the filler is added in the sacrifice layer at a volume ratio equal to or higher than 30%, a high effect by the dress is obtained. Even when the same grooves are formed by blasting, since the sacrifice layer does not have surface tackiness, media are suppressed from adhering to the sacrifice layer. Consequently, it is possible to smoothly form the inner surfaces of the grooves and a problem of shedding of particles of the media is suppressed.

After the grooves are formed, the remaining steps can be implemented as explained below. After the grooves are formed, the upper surface of the ceramic substrate and the inner surfaces of the grooves are coated by photosensitive resin by a method substantially the same as step S10 in FIG. 1. Consequently, a resin layer formed of the photosensitive resin is formed. Subsequently, light having a wavelength for deteriorating a photosensitive resin layer is irradiated to the photosensitive resin layer using an exposing device or the like. At this point, the light is not irradiated to the photosensitive resin layer formed on the upper surface and side surfaces of the ceramic substrate and is irradiated to only the photosensitive resin layer formed on a surface of the sacrifice layer. Consequently, the photosensitive resin layer on the surface of the sacrifice layer is deteriorated. Subsequently, the deteriorated photosensitive resin layer is selectively dissolved by a solvent to remove the photosensitive resin layer on the surface of the sacrifice layer. Subsequently, in a state in which upper surfaces of ceramic devices are stuck to a carrier film, the sacrifice layer is removed by a solution for selectively dissolving the sacrifice layer. Consequently, the ceramic devices are separated from the reinforcing plate. According to the steps explained above, a ceramic device is manufactured. Note that, when the photosensitive resin layer on the surface of the sacrifice layer is deteriorated to a degree enough for allowing the solution to penetrate through the photosensitive resin layer by only exposure, the step of removing the deteriorated photosensitive resin layer does not have to be implemented.

Note that, in the fifth embodiment, the reinforcing plate may be formed of a porous material. In this case, after the grooves are formed, steps may be implemented as explained below. After the grooves are formed, the upper surface of the ceramic substrate and the inner surfaces of the grooves are coated by photosensitive resin by a method substantially the same as step S10 in FIG. 1. Consequently, a resin layer formed of the photosensitive resin is formed. Subsequently, in a state in which upper surfaces of ceramic devices are stuck to a carrier film, the ceramic substrate is immersed in a solution for selectively dissolving the sacrifice layer. Then, the solution reaches the sacrifice layer through pores in the reinforcing plate. Therefore, the sacrifice layer is dissolved and removed. Consequently, the ceramic devices are separated from the reinforcing plate. According to the steps explained above, a ceramic device is manufactured.

Sixth Embodiment

Figure 26:
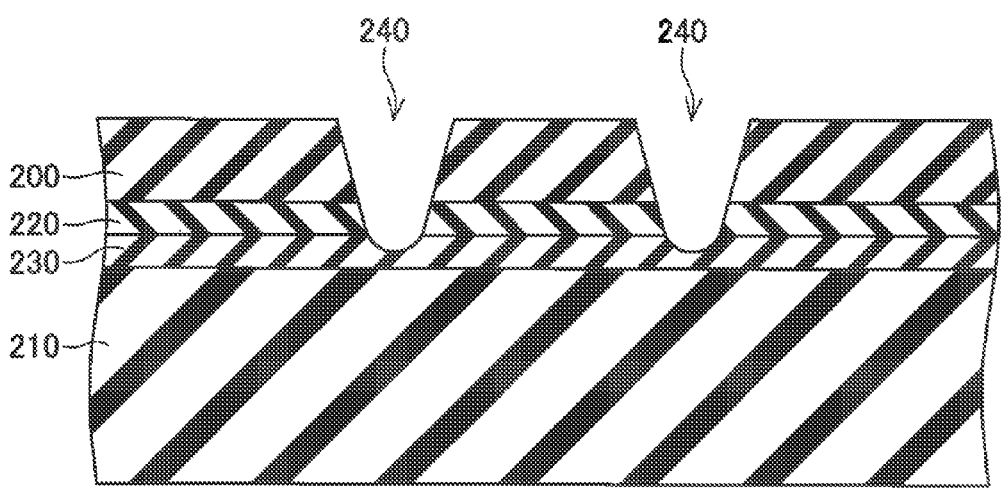
FIG. 26 is a sectional view of a laminated body for explaining a manufacturing method of a reference example 2.

In a manufacturing method according to a sixth embodiment, first, a lower surface of a ceramic substrate is coated with resin. Subsequently, a sacrifice layer is formed on the lower surface of the ceramic substrate (i.e., the surface coated with the resin). Subsequently, the ceramic substrate is adhered to a reinforcing plate via a thermosetting sheet. At this point, the sacrifice layer is in contact with the thermosetting sheet. Thereafter, the thermosetting sheet is hardened. Consequently, the ceramic substrate is fixed to the reinforcing plate. A method for fixing the ceramic substrate to the reinforcing plate via the sacrifice layer and the thermosetting sheet may be, for example, the methods explained in the embodiments or may be other methods. Resin in which a filler is dispersed is used as the thermosetting sheet. That is, the filler is contained in the thermosetting sheet in a dispersed state. The filler is particles harder than the resin in the thermosetting sheet. Silica beads or the like can be used as the filler. After hardening, a glass transition temperature of the thermosetting sheet is 80° C. or more and a Young's modulus of the thermosetting sheet is 6 GPa or more. The resin in the thermosetting sheet is preferably resin not having surface tackiness after hardening such as polyimide, epoxy, or mixed resin of polyimide and epoxy. The sacrifice layer is preferably has a characteristic same as the characteristic in the fifth embodiment. Subsequently, as shown in FIG. 26, by dicing processing the grooves 240 penetrating the ceramic substrate 200 and the sacrifice layer 220 and reaching a thermosetting sheet 230 are formed on an upper surface of a laminated body. However, the grooves 240 are formed not to reach the reinforcing plate 210. When the thermosetting sheet has the characteristic that the glass transition temperature is 80° C. or more and the Young's modulus or 6 GPa or more, the sacrifice layer less easily changes its property even if being heated due to dicing. Therefore, chips are discharged from the grooves without being adhering to a ceramic substrate surface and inner surfaces of the grooves, and the groove inner surfaces are suppressed from being roughened. That is, with the method according to the sixth embodiment, even in forming grooves having their bottom surfaces present in the thermosetting sheet, it is possible to form the grooves with smooth inner surfaces. Further, when the filler is present in the thermosetting sheet, a dicing blade is dressed by the filler during dicing. An edge of the dicing blade is suppressed from being clogged up by the resin (chips of the sacrifice layer and the thermosetting sheet). In particular, when the filler is added in the thermosetting sheet at a volume ratio equal to or higher than 30%, a high effect is obtained by the dress. Even when the same grooves are formed by blasting, since the thermosetting sheet does not have surface tackiness, media are suppressed from adhering to the thermosetting sheet. Consequently, it is possible to smoothly form the inner surfaces of the grooves and a problem of shedding of particles of the media is suppressed.

After the grooves are formed, the remaining steps can be implemented as explained below. After the grooves are formed, the upper surface of the ceramic substrate and the inner surfaces of the grooves are coated by photosensitive resin by a method substantially the same as step S10 in FIG. 1. Consequently, a resin layer formed of the photosensitive resin is formed. Note that, as shown in FIG. 8, the resin layer is formed so that an upper surface of a photosensitive resin layer, which coats bottom surfaces of the grooves, is located at a lower side than a lower surface of the sacrifice layer. Subsequently, light having a wavelength for deteriorating the photosensitive resin layer is irradiated to the resin layer using an exposing device or the like. At this point, the light is not irradiated to the photosensitive resin layer formed on the upper surface and side surfaces of the ceramic substrate and is irradiated to only the photosensitive resin layer formed on side surfaces of the sacrifice layer and a surface of the thermosetting sheet. Consequently, the photosensitive resin layer in a region irradiated by the light is deteriorated. Subsequently, the deteriorated photosensitive resin layer is selectively dissolved by a solvent to remove the photosensitive resin layer on the side surfaces of the sacrifice layer. Subsequently, in a state in which upper surfaces of ceramic devices are stuck to a carrier film, the sacrifice layer is removed by a solution for selectively dissolving the sacrifice layer. Consequently, the ceramic devices are separated from the thermosetting sheet and the reinforcing plate. According to the steps explained above, a ceramic device is manufactured. Note that, when the photosensitive resin layer on the side surfaces of the sacrifice layer is deteriorated to a degree enough for allowing the solution to penetrate through the photosensitive resin layer by only exposure, the step of removing the deteriorated photosensitive resin layer does not have to be implemented.

A material of the sacrifice layer is a relatively expensive material. By partially using the thermosetting sheet as in the sixth embodiment, it is possible to reduce an amount of use of the material of the sacrifice layer and reduce manufacturing cost for the ceramic device.

Note that, in the fifth embodiment and the sixth embodiment, resin of a positive type is used as the photosensitive resin. However, resin of a negative type may be used.

Figure 27:
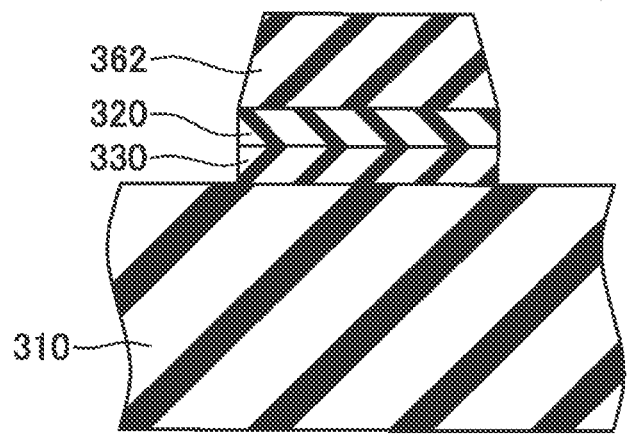
FIG. 27 is a longitudinal sectional view showing a state in which a ceramic device 362 cut beforehand is stuck to a reinforcing plate 310.

The ceramic substrate may be cut to prepare a ceramic device in advance. As shown in FIG. 27, after a ceramic device 362 is fixed to a reinforcing plate 310 via a sacrifice layer 320 and a thermosetting resin 330, a surface of the ceramic device may be coated with resin as in the embodiments explained above. With such a method, it is also possible to suitably coat the surface of the ceramic device with the resin.

The preferable aspects of the technique disclosed in this specification are described as exampled below. The sacrifice layer may be a resin layer that can be dissolved and removed by a specific solution. It is preferable that a Young's modulus of the sacrifice layer is 1 GPa or more. This is for reducing deformation of the ceramic substrate due to a machining load when forming the groove. It is preferable that the sacrifice layer is a material that is stable even if the material comes into contact with resin for coating side surfaces of the groove and is not softened at a heat treatment temperature during hardening of the resin. The reinforcing plate may be a substrate that supports the ceramic substrate to be divided. It is preferable that the reinforcing plate does not have flexibility. It is preferable that the reinforcing plate is harder than the sacrifice layer and has a Young's modulus higher than that of the sacrifice layer (compared in Vickers hardness). This is for suppressing an inner surface of the groove from being roughened. It is more preferable that the reinforcing plate is thicker than the ceramic substrate to be divided. This is for surely supporting and reinforcing the ceramic substrate when being cut. The process for forming the groove may be a process for forming a groove through cutting (so-called dicing) or may be a process for forming a groove through blasting.

In the preferable method, after forming the groove and before removing the sacrifice layer, a supporting member (e.g., a supporting film or a supporting plate) may be stuck to an upper surface of the ceramic substrate (i.e., the divided ceramic devices). When the supporting body is stuck in this way, it is possible to support the ceramic devices even after the sacrifice layer is removed.

The ceramic device may be sometimes coated with resin for prevention of exfoliation of ceramic particles from the ceramic device and improvement of durability of the ceramic device. When the ceramic device is coated with the resin, the abovementioned manufacturing method may be configured as explained below. The manufacturing method may include coating process and irradiating process. During coating after the groove is formed and before the sacrifice layer is removed, the upper surfaces of the ceramic substrates and an inner surface of the groove may be coated with resin to form a resin layer. The resin may have a characteristic to change property thereof by receiving light. The irradiation may include (i) irradiating light to the resin layer on side surfaces of the sacrifice layer in the groove without irradiating the light to the resin layer on the upper surfaces of the ceramic substrates and on side surfaces of the ceramic substrates in the groove, or (ii) irradiating light to the resin layer on the upper surfaces of the ceramic substrates and on the side surfaces of the ceramic substrates in the groove without irradiating the light to the resin layer on the side surfaces of the sacrifice layer in the groove. When the sacrifice layer is removed, liquid for solving the sacrifice layer may be caused to enter in the groove so that the sacrifice layer is solved from the side surfaces of the sacrifice layer in the groove. Note that the resin having the characteristic to change property thereof by receiving light only has to be resin having a characteristic to change property by receiving light having a specific wavelength (e.g., an ultraviolet ray) and does not need to be resin having a characteristic to change property with lights having all wavelengths.

In this manufacturing method, the upper surfaces of the ceramic substrates and the inner surface of the groove are coated using the resin having the characteristic to change property by receiving light (e.g., light having a specific wavelength). Consequently, the resin layer is formed on an upper surface and side surfaces of the ceramic device. After the completion of resin coat, light is irradiated to any one of the resin layer on the upper surfaces and the side surfaces of the ceramic substrates and the resin layer on the side surfaces of the sacrifice layer to vary property of the resin layers. This process can be implemented by, for example, irradiating light to the upper surfaces of the ceramic substrates via a predetermined mask. Note that the resin layer on the side surfaces of the sacrifice layer may be thereafter selectively removed or, when the resin layer on the side surfaces of the sacrifice layer allows the liquid to penetrate through the resin layer (e.g., the resin layer on the side surfaces of the sacrifice layer is cracked by the irradiation of the light), the resin layer on the side surfaces of the sacrifice layer may be left. When a resin layer of a negative type (a type to stabilize by receiving light) is used, light can be irradiated to the resin layer on the upper surfaces and the side surfaces of the ceramic substrates. When a resin layer of a positive type (a type to be soluble or to have a characteristic of allowing liquid to penetrate through the resin layer by receiving light) is used, light can be irradiated to the resin layer on the side surfaces of the sacrifice layer. When removing the sacrifice layer, a solution is caused to enter in the groove. Since the resin layer on the side surfaces of the sacrifice layer is removed or configured to allow the liquid to penetrate through the resin layer, the sacrifice layer can be dissolved from an inner side of the groove. By dissolving and removing the sacrifice layer, the ceramic device is separated from the reinforcing plate. Consequently, the ceramic device, the upper surface and the side surfaces of which are coated with the resin, is obtained. With the manufacturing method, even when a small ceramic device difficult to be handled is manufactured, it is possible to efficiently apply resin coat to the cut surface (i.e., the inner surface of the groove).

In the manufacturing method including the irradiation of the light, the reinforcing plate may be formed of a light transmissive material. In the irradiation of the light, the light may be irradiated to a lower surface of the reinforcing plate to change property of the resin layer on a surface of the reinforcing plate in the groove and on the side surfaces of the sacrifice layer.

With such a configuration, the ceramic device (the ceramic substrates separated by the groove) itself functions as a mask to prevent the light from irradiating to the resin layer on the upper surface and the side surfaces of the ceramic device. Therefore, it is possible to irradiate, with high position accuracy, the light on the resin layer on the surface of the reinforcing plate in the groove and the resin layer on the side surface of the sacrifice layer without irradiating the light to the resin layer on the upper surface and the side surfaces of the ceramic device.

The ceramic device, the upper surface and the side surfaces of which are coated with the resin, can be manufactured by a method explained below. In this manufacturing method, the reinforcing plate may be formed of a porous material. This method may further comprise coating, after the groove is formed and before the sacrifice layer is removed, the upper surfaces of the ceramic substrates and an inner surface of the groove with resin to form a resin layer thereon. When the sacrifice layer is removed, liquid for solving the sacrifice layer may be caused to flow from a lower surface of the reinforcing plate into pores in the reinforcing plate and reach the sacrifice layer to solve the sacrifice layer.

In the manufacturing method, after forming the groove, the upper surfaces of the ceramic substrate and the inner surface of the groove are coated with the resin. Consequently, the upper surfaces and the side surfaces of the ceramic devices are coated with the resin. When the inner surface of the groove is coated with the resin, the sacrifice layer cannot be dissolved from an inside of the groove. Therefore, in the manufacturing method, a solution is caused to penetrate through the pores in the reinforcing plate from a lower surface side of the porous reinforcing plate and reach the sacrifice layer through the pores. Consequently, it is possible to dissolve and remove the sacrifice layer. When the sacrifice layer is removed, the ceramic device is separated from the reinforcing plate. Consequently, the ceramic device, the upper surface and the side surfaces of which are coated with the resin, is obtained. In the manufacturing method, even when a small ceramic device difficult to be handled is manufactured, it is also possible to efficiently apply resin coat to the cut surface (i.e., the inner surface of the groove).

Note that, when the inner surface of the groove is coated with the resin, the resin tends to accumulate on the bottom surface of the groove. Therefore, the resin layer formed on the bottom surface of the groove is thick. In the resin layer for coating the side surfaces of the groove, the resin layer in a position close to the resin layer on the bottom surface of the groove tends to be thick. When the thick resin layer is formed on the side surfaces of the sacrifice layer in this way, a problem occurs. For example, in a method for changing property of the resin layer on the side surfaces of the sacrifice layer with light, when the resin layer on the side surfaces of the sacrifice layer is thick, processing for a long time is necessary to change property of the resin layer on the side surfaces of the sacrifice layer or remove the resin layer. The resin layer in other regions may be damaged. In the method for using the reinforcing plate formed of the porous material, after the sacrifice layer is removed, the resin layer that covers the side surfaces of the sacrifice layer is difficult to be cut and is likely to remains. Therefore, it is difficult to separate the ceramic device from the reinforcing plate.

Therefore, in any one of the abovementioned manufacturing methods for performing the resin coat, the upper surface of the resin layer coating the bottom surface of the groove may be located at a lower side than a lower surface of the sacrifice layer.

With such a configuration, the resin layer on the side surfaces of the sacrifice layer from becoming thick. Therefore, it is possible to suppress the abovementioned problem from occurring.

Any one of the abovementioned manufacturing methods for obtaining the ceramic device, the upper surface and the side surfaces of which are coated with the resin, can further includes coating a lower surface of the ceramic substrate with resin to make a resin layer before the ceramic substrate is fixed to the reinforcing plate. When the ceramic substrate is fixed to the reinforcing plate, the ceramic substrate may be fixed by causing the resin layer on the lower surface of the ceramic substrate to be in contact with the sacrifice layer.

With such a configuration, the ceramic device, not only the upper surface and the side surfaces but also the lower surface of which are coated, can be obtained.

Any one of the abovementioned manufacturing methods may include adhering a thermosetting sheet on the upper surface of the reinforcing plate before the ceramic substrate is fixed to the reinforcing plate, and forming the sacrifice layer on the lower surface of the ceramic substrate before the ceramic substrate is fixed to the reinforcing plate. When the ceramic substrate is fixed to the reinforcing plate, the ceramic substrate may be fixed by causing the sacrifice layer to be in contact with the thermosetting sheet.

With such a configuration, it is also possible to suitably fix the ceramic substrate to the reinforcing plate.

Note that, in this application, suitable examples of the reinforcing plate include porous glass and porous ceramics (alumina, zirconium, and magnesia). Further, suitable examples of the light transmissive reinforcing plate include glass, light transmissive alumina, sapphire, and SiC.

The specific examples of the present embodiments are specifically explained above. However, these specific examples are merely illustrations and do not limit the scope of claims. Various modifications and alterations of the specific examples illustrated above are included in the techniques described in claims. The technical elements explained in this specification or the drawings exhibit technical utility independently or through various combinations and are not limited to a combination described in claims as filed. The techniques illustrated in this specification or the drawings can simultaneously attain a plurality of objects, and attaining one of the objects per se offers technical utility.

The invention claimed is:

1. A method for manufacturing a ceramic device, the method comprising:
    fixing a ceramic substrate to a reinforcing plate via a sacrifice layer;
    forming a groove on an upper surface of the ceramic substrate to divide the ceramic substrate into plural ceramic substrates, the groove penetrating the ceramic substrate and the sacrifice layer and reaching the reinforcing plate;
    coating an inner surface of the groove with resin to form a resin layer; and
    removing the sacrifice layer.

2. The method of claim 1, wherein the resin has a characteristic to change property thereof by receiving light, and
    (i) irradiating light to the resin layer on side surfaces of the sacrifice layer in the groove without irradiating the light to the resin layer on side surfaces of the ceramic substrates in the groove, or (ii) irradiating light to the resin layer on the side surfaces of the ceramic substrates in the groove without irradiating the light to the resin layer on the side surfaces of the sacrifice layer in the groove,
    wherein, when the sacrifice layer is removed, liquid for solving the sacrifice layer is caused to enter in the groove so that the sacrifice layer is solved from the side surfaces of the sacrifice layer in the groove.

3. The method of claim 2, wherein
    the reinforcing plate is formed of a light transmissive material, and
    the light is irradiated to a lower surface of the reinforcing plate to change property of the resin layer on a surface of the reinforcing plate in the groove and on the side surfaces of the sacrifice layer in the groove.

4. The method of claim 2, wherein an upper surface of the resin layer coating a bottom surface of the groove is located lower than a lower surface of the sacrifice layer.

5. The method of claim 2, further comprising coating a lower surface of the ceramic substrate with resin to make a resin layer before the ceramic substrate is fixed to the reinforcing plate,
    wherein, when the ceramic substrate is fixed to the reinforcing plate, the ceramic substrate is fixed by causing the resin layer on the lower surface of the ceramic substrate to be in contact with the sacrifice layer.

6. The method of claim 2, further comprising:
    adhering a thermosetting sheet on an upper surface of the reinforcing plate before the ceramic substrate is fixed to the reinforcing plate; and
    forming the sacrifice layer on a lower surface of the ceramic substrate before the ceramic substrate is fixed to the reinforcing plate,
    wherein, when the ceramic substrate is fixed to the reinforcing plate, the ceramic substrate is fixed by causing the sacrifice layer to be in contact with the thermosetting sheet.

7. The method of claim 1, wherein
the reinforcing plate is formed of a porous material,
and
when the sacrifice layer is removed, liquid for solving the sacrifice layer is caused to flow from a lower surface of the reinforcing plate into pores in the reinforcing plate and reach the sacrifice layer to solve the sacrifice layer.

8. The method of claim 7, wherein an upper surface of the resin layer coating a bottom surface of the groove is located lower than a lower surface of the sacrifice layer.

9. The method of claim 7, further comprising coating a lower surface of the ceramic substrate with resin to make a resin layer before the ceramic substrate is fixed to the reinforcing plate,
wherein, when the ceramic substrate is fixed to the reinforcing plate, the ceramic substrate is fixed by causing the resin layer on the lower surface of the ceramic substrate to be in contact with the sacrifice layer.

10. The method of claim 7, further comprising:
adhering a thermosetting sheet on an upper surface of the reinforcing plate before the ceramic substrate is fixed to the reinforcing plate; and
forming the sacrifice layer on a lower surface of the ceramic substrate before the ceramic substrate is fixed to the reinforcing plate,
wherein, when the ceramic substrate is fixed to the reinforcing plate, the ceramic substrate is fixed by causing the sacrifice layer to be in contact with the thermosetting sheet.

11. A method for manufacturing a ceramic device, the method comprising:
fixing a ceramic substrate to a reinforcing plate via a sacrifice layer;
forming a groove on an upper surface of the ceramic substrate to divide the ceramic substrate into plural ceramic substrates, the groove penetrating the ceramic substrate and reaching the sacrifice layer;
coating an inner surface of the groove with resin to form a resin layer; and
removing the sacrifice layer,
wherein the sacrifice layer includes a resin portion and particles dispersed in the resin portion, the particles are harder than the resin portion, a glass transition temperature of the sacrifice layer is 80 degrees Celsius or more, and a Young's modulus of the sacrifice layer is 6 GPa or more.

12. The method of claim 11, wherein the resin has a characteristic to change property thereof by receiving light, and
(i) irradiating light to the resin layer on side surfaces of the sacrifice layer in the groove without irradiating the light to the resin layer on side surfaces of the ceramic substrates in the groove, or (ii) irradiating light to the resin layer on the side surfaces of the ceramic substrates in the groove without irradiating the light to the resin layer on the side surfaces of the sacrifice layer in the groove,
wherein, when the sacrifice layer is removed, liquid for solving the sacrifice layer is caused to enter in the groove so that the sacrifice layer is solved from the side surfaces of the sacrifice layer in the groove.

13. The method of claim 11, wherein
the reinforcing plate is formed of a porous material,
and
when the sacrifice layer is removed, liquid for solving the sacrifice layer is caused to flow from a lower surface of the reinforcing plate into pores in the reinforcing plate and reach the sacrifice layer to solve the sacrifice layer.

14. The method of claim 11, further comprising coating a lower surface of the ceramic substrate with resin to make a resin layer before the ceramic substrate is fixed to the reinforcing plate,
wherein, when the ceramic substrate is fixed to the reinforcing plate, the ceramic substrate is fixed by causing the resin layer on the lower surface of the ceramic substrate to be in contact with the sacrifice layer.

15. A method of manufacturing a ceramic device, comprising:
forming a sacrifice layer on a lower surface of a ceramic substrate;
fixing the ceramic substrate to a reinforcing plate via a thermosetting sheet so that the thermosetting sheet is in contact with the sacrifice layer;
forming a groove on an upper surface of the ceramic substrate to divide the ceramic substrate into plural ceramic substrates, the groove penetrating the ceramic substrate and the sacrifice layer and reaching the reinforcing plate;
coating an inner surface of the groove with resin to form a resin layer; and
removing the sacrifice layer,
wherein the thermosetting sheet includes a resin portion and particles dispersed in the resin portion, the particles are harder than the resin portion, a glass transition temperature of the thermosetting sheet is 80 degrees Celsius or more, and a Young's modulus of the thermosetting sheet is 6 GPa or more.

16. The method of claim 15, wherein the resin has a characteristic to change property thereof by receiving light, and
(i) irradiating light to the resin layer on side surfaces of the sacrifice layer in the groove without irradiating the light to the resin layer on side surfaces of the ceramic substrates in the groove, or (ii) irradiating light to the resin layer on the side surfaces of the ceramic substrates in the groove without irradiating the light to the resin layer on the side surfaces of the sacrifice layer in the groove,
wherein, when the sacrifice layer is removed, liquid for solving the sacrifice layer is caused to enter in the groove so that the sacrifice layer is solved from the side surfaces of the sacrifice layer in the groove.

17. The method of claim 16, wherein an upper surface of the resin layer coating a bottom surface of the groove is located lower than a lower surface of the sacrifice layer.

18. The method of claim 1, wherein when coating the inner surface of the groove with the resin, the upper surface of the ceramic substrate is coated with the resin to form the resin layer.

* * * * *